United States Patent
Stanley et al.

(10) Patent No.: US 6,703,845 B2
(45) Date of Patent: Mar. 9, 2004

(54) OCCUPANT SENSOR

(75) Inventors: James Gregory Stanley, Novi, MI (US); Judson G. McDonnell, Farmington Hills, MI (US); James A. Campbell, Ann Arbor, MI (US)

(73) Assignee: Automotive Systems Laboratory, Inc., Farmington Hills, MI (US)

( * ) Notice: Subject to any disclaimer, the term of this patent is extended or adjusted under 35 U.S.C. 154(b) by 170 days.

(21) Appl. No.: 09/866,885

(22) Filed: May 29, 2001

(65) Prior Publication Data

US 2001/0045733 A1 Nov. 29, 2001

Related U.S. Application Data

(60) Provisional application No. 60/207,536, filed on May 26, 2000.

(51) Int. Cl.[7] ............................ G01R 27/26; B60R 21/32
(52) U.S. Cl. ........................................ 324/663; 280/735
(58) Field of Search ................................. 324/660, 662, 324/663, 671, 674, 676, 685, 686; 280/735; 701/45

(56) References Cited

U.S. PATENT DOCUMENTS

| | | | |
|---|---|---|---|
| 3,111,608 A | 11/1963 | Boenning et al. | ............ 361/179 |
| 3,177,481 A | 4/1965 | Joy et al. | ................. 246/167 R |
| 3,237,105 A | 2/1966 | Kalmus | ........................ 340/562 |
| 3,324,848 A | 6/1967 | Domeier et al. | ............ 600/535 |
| 3,439,358 A | 4/1969 | Salmons | ..................... 340/552 |
| 3,740,567 A | 6/1973 | Atkins | ..................... 307/10 SB |
| 3,806,867 A | 4/1974 | Quantz | ..................... 340/52 E |
| 3,898,472 A | 8/1975 | Long | ...................... 307/10 SB |
| 3,943,376 A | 3/1976 | Long | ........................... 307/116 |
| 4,008,712 A | 2/1977 | Nyboer | ..................... 128/2.1 Z |

(List continued on next page.)

FOREIGN PATENT DOCUMENTS

EP    1 066 178 B1    5/2002    ........... B60R/21/00

OTHER PUBLICATIONS

H. Philipp, "The Charge Transfer Sensor", Sensors magazine, Nov., 1996.
Jinno K.; Ofuji, M.; Saito, T.; Sekido, S.; "Occupant Sensing Utilizing Perturbation of Electric Fields", SAE 971051, Reprinted from: Anthropomorphic Dummies and Crash Instrumentation Sensors (SP–1261), SAE International Congress & Exposition, Detroit, MI Feb. 24–27, 1997.
Fink, Donald G. and Beaty, H. W.; Standard Handbook for Electrical Engineers 12th ed., McGraw–Hill Book Co, 1987, pp. 3–57 through 3–65.
Smith, J.R.; "Field Mice: Extracting hand geometry from electric field measurements", IBM Systems Journal, vol. 35, NOS. 3&4, 1996.
Reference Data for Engineers: Radio, Electronics, Computer, and Communications 7th edition, E.C. Jordon editor in chief, Howard W. Sams, 1985, pp. 12–3 through 12–12.

Primary Examiner—John E. Chapman
Assistant Examiner—James Kerveros
(74) Attorney, Agent, or Firm—Dinnin & Dunn, P.C.

(57) ABSTRACT

An oscillatory or pulsed first signal is applied to a seat heating element that is operatively connected to first and second impedances that isolate the first signal from the source and sink of power to the heating element. In another embodiment, third and fourth impedances are connected to the first an second impedances at respective nodes, and a second signal substantially equal to the first signal is operatively coupled to the nodes. In another embodiment, the first signal is applied to an electrode, and the second signal is applied to the heating element, which shields the electrode from influence by the seat. In another embodiment, the first signal is applied to a first electrode that is shielded from the heating element by a second electrode operatively coupled to the second signal. The impedances may, for example, be provided by inductors or electronic switches.

74 Claims, 8 Drawing Sheets

U.S. PATENT DOCUMENTS

| | | | |
|---|---|---|---|
| 4,300,116 A | 11/1981 | Stahovec | 340/32 |
| 4,430,645 A | 2/1984 | Eskandry et al. | 340/572 |
| 4,586,260 A | 5/1986 | Baxter et al. | 33/125 |
| 4,766,368 A | 8/1988 | Cox | 324/61 P |
| 4,796,013 A | 1/1989 | Yasuda et al. | 340/562 |
| 4,831,279 A | 5/1989 | Ingraham | 307/116 |
| 4,833,393 A | 5/1989 | Wetzel | 324/60 SD |
| 4,853,617 A | 8/1989 | Douglas et al. | 324/67 |
| 4,887,024 A | 12/1989 | Sugiyama et al. | 324/674 |
| 4,911,175 A | 3/1990 | Shizgal | 128/734 |
| 4,947,862 A | 8/1990 | Kelly | 128/734 |
| 4,980,519 A | 12/1990 | Mathews | 178/19 |
| 5,071,160 A | 12/1991 | White et al. | 280/735 |
| 5,074,583 A | 12/1991 | Fujita et al. | 280/735 |
| 5,118,134 A | 6/1992 | Mattes et al. | 280/735 |
| 5,161,820 A | 11/1992 | Vollmer | 280/730 |
| 5,164,709 A | 11/1992 | Lamberty et al. | 340/667 |
| 5,166,679 A | 11/1992 | Vranish et al. | 340/870.37 |
| 5,177,445 A | 1/1993 | Cross | 324/637 |
| 5,214,388 A | 5/1993 | Vranish et al. | 324/683 |
| 5,229,579 A | 7/1993 | Ingraham et al. | 219/202 |
| 5,231,358 A | 7/1993 | Kapsokavathis et al. | 324/672 |
| 5,232,243 A | 8/1993 | Blackburn et al. | 280/732 |
| 5,247,261 A | 9/1993 | Gershenfeld | 324/716 |
| 5,247,281 A | 9/1993 | Facon et al. | 340/562 |
| 5,330,226 A | 7/1994 | Gentry et al. | 280/735 |
| 5,363,051 A | 11/1994 | Jenstrom et al. | 324/661 |
| 5,366,241 A | 11/1994 | Kithil | 280/735 |
| 5,372,141 A | 12/1994 | Gallup et al. | 172/734 |
| 5,373,245 A | 12/1994 | Vranish | 324/662 |
| 5,398,185 A | 3/1995 | Omura | 364/424.05 |
| 5,411,289 A | 5/1995 | Smith et al. | 280/735 |
| 5,413,378 A | 5/1995 | Steffens, Jr. et al. | 280/735 |
| 5,416,425 A | 5/1995 | Mouaici | 324/690 |
| 5,436,613 A | 7/1995 | Ghosh et al. | 340/573 |
| 5,437,184 A | 8/1995 | Shillady | 73/304 C |
| 5,439,249 A | 8/1995 | Steffens, Jr. et al. | 280/735 |
| 5,442,347 A | 8/1995 | Vranish | 340/870.37 |
| 5,446,391 A | 8/1995 | Aoki et al. | 324/661 |
| 5,446,661 A | 8/1995 | Gioutsos et al. | 364/424.05 |
| 5,454,591 A | 10/1995 | Mazur et al. | 280/735 |
| 5,469,364 A | 11/1995 | Hughey et al. | 364/482 |
| 5,474,327 A | 12/1995 | Schousek | 280/735 |
| 5,482,314 A | 1/1996 | Corrado et al. | 280/735 |
| 5,490,069 A | 2/1996 | Gioutsos et al. | 280/735 |
| 5,494,311 A | 2/1996 | Blackburn et al. | 280/735 |
| 5,515,933 A | 5/1996 | Meyer et al. | 180/273 |
| 5,525,843 A | 6/1996 | Howing | 307/9.1 |
| 5,539,292 A | 7/1996 | Vranish | 318/568.21 |
| 5,570,903 A | 11/1996 | Meister et al. | 280/735 |
| 5,573,269 A | 11/1996 | Gentry et al. | 280/735 |
| 5,602,734 A | 2/1997 | Kithil | 364/424.055 |
| 5,612,876 A | 3/1997 | Zeidler et al. | 364/424.055 |
| 5,618,056 A | 4/1997 | Schoos et al. | 280/735 |
| 5,624,132 A | 4/1997 | Blackburn et al. | 280/735 |
| 5,626,359 A | 5/1997 | Steffens, Jr. et al. | 280/735 |
| 5,636,864 A | 6/1997 | Hori | 280/735 |
| 5,654,643 A | 8/1997 | Bechtel et al. | 324/687 |
| 5,672,976 A | 9/1997 | Egger et al. | 324/668 |
| 5,691,693 A | 11/1997 | Kithil | 340/439 |
| 5,722,686 A | 3/1998 | Blackburn et al. | 280/735 |
| 5,724,024 A | 3/1998 | Sonderegger et al. | 340/562 |
| 5,726,581 A | 3/1998 | Vranish | 324/688 |
| 5,730,165 A | 3/1998 | Philipp | 137/1 |
| 5,748,473 A | 5/1998 | Breed et al. | 364/424.055 |
| 5,770,997 A | 6/1998 | Kleinberg et al. | 280/235 |
| 5,793,176 A | 8/1998 | Novak | 318/587 |
| 5,802,479 A | 9/1998 | Kithil et al. | 701/45 |
| 5,822,707 A | 10/1998 | Breed et al. | 701/49 |
| 5,838,233 A | 11/1998 | Hawes et al. | 340/572 |
| 5,844,415 A | 12/1998 | Gershenfeld et al. | 324/663 |
| 5,844,486 A | 12/1998 | Kithil et al. | 340/573 |
| 5,848,661 A | 12/1998 | Fu | 180/273 |
| 5,864,295 A | 1/1999 | Jarocha | 340/667 |
| 5,871,232 A | 2/1999 | White | 280/735 |
| 5,883,591 A | 3/1999 | McEwan | 342/22 |
| 5,890,085 A | 3/1999 | Corrado et al. | 701/47 |
| 5,894,207 A | 4/1999 | Goings | 318/478 |
| 5,913,536 A | 6/1999 | Brown | 280/730.2 |
| 5,914,610 A | 6/1999 | Gershenfeld et al. | 324/663 |
| 5,948,031 A | 9/1999 | Jinno et al. | 701/45 |
| 5,961,144 A | 10/1999 | Desmarais | 280/731 |
| 5,964,478 A | 10/1999 | Stanley et al. | 280/735 |
| 6,014,602 A | 1/2000 | Kithil et al. | 701/45 |
| 6,024,378 A | 2/2000 | Fu | 280/735 |
| 6,031,380 A | 2/2000 | Gleixner et al. | 324/683 |
| 6,043,736 A | 3/2000 | Sawahata et al. | 340/438 |
| 6,043,743 A | 3/2000 | Saito et al. | 340/562 |
| 6,066,954 A | 5/2000 | Gershenfeld et al. | 324/671 |
| 6,079,738 A | 6/2000 | Lotito et al. | 280/735 |
| 6,094,610 A | 7/2000 | Steffens, Jr. et al. | 701/45 |
| 6,135,494 A | 10/2000 | Lotito et al. | 280/731 |
| 6,140,622 A | 10/2000 | Goings et al. | 219/506 |
| 6,158,768 A | 12/2000 | Steffens, Jr. et al. | 280/735 |
| 6,161,070 A | 12/2000 | Jinno et al. | 701/45 |
| 6,199,901 B1 | 3/2001 | Iizuka | |
| 6,199,904 B1 | 3/2001 | Dosdall | 280/735 |
| 6,208,249 B1 | 3/2001 | Saito et al. | 340/561 |
| 6,224,095 B1 | 5/2001 | Schifflechner | 280/735 |
| 6,260,879 B1 | 7/2001 | Stanley | 280/735 |
| 6,270,114 B2 | 8/2001 | Mai et al. | 280/735 |

OCCUPANT SENSOR

CROSS-REFERENCE TO RELATED APPLICATIONS

The instant application claims the benefit of prior U.S. Provisional Application Serial No. 60/207,536 filed on May 26, 2000, which is incorporated herein by reference.

The following co-pending, commonly owned patent applications are incorporated herein by reference: U.S. application Ser. No. 09/474,600 entitled Occupant Detection System, filed on Dec. 29, 1999 ("ASL-222-US"); U.S. application Ser. No. 09/474,470 entitled Occupant Detection System, filed on Dec. 29, 1999 ("ASL-228-US"); U.S. application Ser. No. 09/568,596 entitled Occupant Detection System, filed on May 10, 2000 ("ASL-234-US"); U.S. application Ser. No. 09/474,473 entitled Occupant Detection System, filed on Dec. 29, 1999 ("ASL-257-US"); U.S. application Ser. No. 09/474,673 entitled Occupant Detection System, filed on Dec. 29, 1999 ("ASL-258-US"); U.S. application Ser. No. 09/474,469 entitled Occupant Detection System, filed on Dec. 29, 1999 ("ASL-259-US"); U.S. application Ser. No. 09/520,866 entitled Proximity Sensor, filed on Mar. 6, 2000 ("ASL-225-US"); U.S. application Ser. No. 09/614,086 entitled Occupant Sensor, filed on Jul. 11, 2000 ("ASL-236-US"); and U.S. application Ser. No. 09/616,406 entitled Proximity Sensor, filed on Jul. 14, 2000 ("ASL-237-US").

BACKGROUND OF THE INVENTION

U.S. Pat. No. 5,525,843 discloses a seat occupant detection system that uses a seat heater element as an electrode of a capacitive sensor, wherein a pair of relay activated switches are used to either isolate or connect the heating element from or to the associated current supply and ground, wherein the heating element is isolated when sensing the occupant and is otherwise connected when heating the seat. One potential limitation with such an arrangement is that relay controlled switch elements may not be sufficiently reliable for safety applications, such as controlling the actuation of a safety restraint system.

FIELD OF THE INVENTION

A vehicle may contain safety restraint actuators that are activated responsive to a vehicle crash for purposes of mitigating occupant injury. Examples of such automatic safety restraint actuators include air bags, seat belt pretensioners, and side curtains. One objective of an automatic restraint system is to mitigate occupant injury, thereby not causing more injury with the automatic restraint system than would be caused by the crash had the automatic restraint system not been activated. Generally, it is desirable to only activate automatic safety restraint actuators when needed to mitigate injury because of the expense of replacing the associated components of the safety restraint system, and because of the potential for such activations to harm occupants.

One technique for mitigating injury to occupants by the air bag inflator is to control the activation of the inflator responsive to the presence and/or position of the occupant, thereby activating the inflator only when an occupant is positioned outside an associated at-risk zone of the inflator. NHTSA data suggests that severe injuries due to close proximity with the inflator can be reduced or eliminated if the air bag is disabled when the occupant is closer than approximately 4 to 10 inches from the inflator door. Such a system for disabling the air bag inflator requires an occupant sensor that is sufficiently sensitive and robust to make such a determination, while not causing the air bag inflator to be disabled when otherwise required for providing occupant restraint.

One technique for detecting the presence and/or position of an occupant is by sensing the influence of an occupant upon an electric field generated proximate to a seat for which the presence and/or position. An occupant has associated dielectric and conductive properties that can influence an electric field, and accordingly the occupant is an electric-field-influencing medium that can be detected with an electric field sensor—sometimes also known as a capacitive sensor.

As used herein, the term "electric field sensor" refers to a sensor that generates a signal responsive to the influence of a sensed object upon an electric field. Generally, an electric field sensor comprises at least one electrode to which is applied at least one applied signal; and at least one electrode—which could be the same electrode or electrodes to which the applied signal is applied—at which a received signal (or response) is measured. The applied signal generates an electric field from the at least one electrode to a ground in the environment of the at least one electrode, or to another at least one electrode. The applied and received signals can be associated with the same electrode or electrodes, or with different electrodes. The particular electric field associated with a given electrode or set of electrodes is dependent upon the nature and geometry of the electrode or set of electrodes and upon the nature of the surroundings thereto, for example the dielectric properties of the surroundings. For a fixed electrode geometry, the received signal or signals of an electric field sensor are responsive to the applied signal or signals and to the nature of the environment influencing the resulting electric field, for example to the presence and location of an object with a permittivity or conductivity different to that of its surroundings.

One form of electric field sensor is a capacitive sensor, wherein the capacitance of one or more electrodes is measured—from the relationship between received an applied signals—for a given electrode configuration. The technical paper "Field mice: Extracting hand geometry from electric field measurements" by J. R. Smith, published in IBM Systems Journal, Vol. 35, Nos. 3&4, 1996, pp. 587–608, incorporated herein by reference, describes the concept of electric field sensing as used for making non-contact three-dimensional position measurements, and more particularly for sensing the position of a human hand for purposes of providing three dimensional positional inputs to a computer. What has commonly been referred to as capacitive sensing actually comprises the distinct mechanisms of what the author refers to as "loading mode", "shunt mode", and "transmit mode" which correspond to various possible electric current pathways. In the shunt mode, a voltage oscillating at low frequency is applied to a transmit electrode, and the displacement current induced at a receive electrode is measured with a current amplifier, whereby the displacement current may be modified by the body being sensed. In the "loading mode", the object to be sensed modifies the capacitance of a transmit electrode relative to ground. In the transmit mode, the transmit electrode is put in contact with the user's body, which then becomes a transmitter relative to a receiver, either by direct electrical connection or via capacitive coupling.

A seat-based capacitive sensor can be affected by seat heater when co-located in the same area of the seat as the seat heater. A seat heater is typically a low resistance conductor (i.e. approximately 1Ω) in an under layer of the seat cover. In operation, a direct current of several amperes is sent through the heater element to generate heat. The heater element appears to be a ground to a capacitive sensor measuring the impedance to ground with an oscillatory or pulsed voltage.

BRIEF DESCRIPTION Of THE DRAWINGS

In the accompanying drawings:

FIG. 8a illustrates a schematic diagram of an embodiment of a circuit for providing both amplitude and phase information from an electric field sensor;

FIG. 8b illustrates the operation of various elements of the sensing circuit of FIG. 8a;

DESCRIPTION OF EMBODIMENT(S)

The above-noted problems may be overcome as described and claimed hereinbelow.

Figure 1:
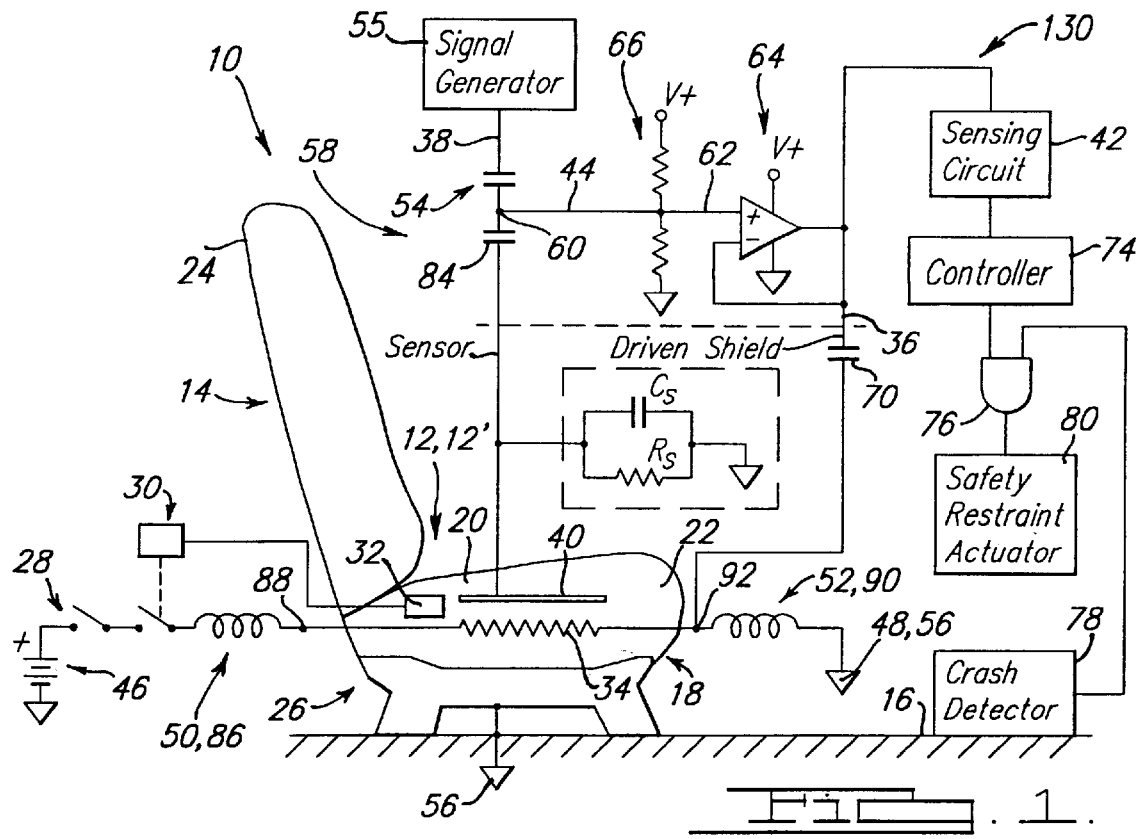
FIG. 1 illustrates an embodiment of an occupant sensor in a seat with a seat heater.

Referring to FIG. 1, an occupant sensor 10 comprises an electric field sensor 12 for detecting an occupant on a seat 14 of a vehicle 16. The electric field sensor 12 is, for example, placed in the seat bottom 18 under a seat cover 20 and close to the top of a foam cushion 22, but may be located elsewhere, for example in the seat back 24, for other occupant sensing applications.

The seat 14 further incorporates a seat heater 26 for heating the seat 14 so as to provide a comfortable seating environment for the occupant. The seat heater 26 is activated by an ON-OFF switch 28, and the temperature thereof is regulated, for example, by a relay 30 under control of a thermostat 32. The seat heater 26 comprises a heating element 34, for example, a resistive heating element, that is sufficiently conductive to either function as an electrode of an electric field sensor 12, or function as an electrode that could influence an electric field sensor 12 proximate thereto.

Generally, the effects of any conductor—including a separate heating element 34—on a electric field sensor 12 can be eliminated, or at least substantially reduced, by driving that conductor with a signal—known as a driven shield signal 36—having substantially the same potential variations (i.e. amplitude and phase) as an applied signal 38 applied to a sensor electrode 40 of the electric field sensor 12. By driving the separate heating element 34 with a driven shield signal 36, substantially no current flows between the heating element 34 and a sensor electrode 40 of the electric field sensor 12 proximate thereto, thus making the seat heater 26 element substantially invisible to the capacitive sensor 12'. Moreover, the electric field sensor 12 and the heating element 34 need not be at the same DC offset if the associated sensing circuit 42 is responsive substantially only to an AC or pulsed component of a sensed signal 44 from the electric field sensor 12.

One problem associated with driving the seat heater 26 with a driven shield signal 36 is that the seat heater 26 typically has a relatively low impedance either to the source of power 46—i.e. the current source or vehicle battery—or the sink of power 48—i.e. ground—operatively connected to the seat heater 26. Without further modification, this would require the circuit driving the seat heater 26 with the driven shield signal 36 to have a relatively large current capability.

Referring to FIG. 1, one solution to this problem is to place relatively high current capacity first 50 and second 52 inductors in series with the heating element 34, respectively between the heating element 34 and the source of power 46, and between the heating element 34 and the sink of power 48, wherein the inductance of the first 50 and second 52 inductors is chosen such that their respective impedances are relatively high at the frequency, or frequencies of the applied signal 38, so that the first 50 and second 52 inductors act as chokes thereto. Accordingly, because of the relatively high impedance first 50 and second 52 inductors, the driven shield signal 36 can be AC coupled to the heating element 34 without being substantially loaded by the source of power 46 or the sink of power 48.

The electric field sensor 12 is either what is commonly known as a capacitive sensor 12', or more generally an electric field sensor operating in any of the above described modes. The electric field sensor 12 comprises at least one sensor electrode 40 operatively coupled by a bridge capacitor 54 to an applied signal 38 generated by a signal generator 55, so as to generate an electric field proximate to the at least one sensor electrode 40 responsive to the applied signal 38. The applied signal 38 for example comprises either an oscillating or pulsed signal. As illustrated in FIG. 1, the sensor electrode 40 is modeled as a parallel combination of a capacitance Cs and a resistance Rs, to circuit ground 56. The series combination of the bridge capacitor 54 and the sensor electrode 40 acts as an AC voltage divider 58, whereby the AC signal level of the sensed signal 44 at the node 60 therebetween is responsive to the impedance of the sensor electrode 40, which is in turn responsive to at least one electric-field-influencing property—for example dielectric constant, conductivity, size, mass or distance—of an object proximate to the electric field sensor 12. The node 60—and the sensed signal 44 thereat—is operatively connected to an input 62 of a voltage follower buffer amplifier 64, which input 62 is DC biased by an associated resistive divider network 66 between power V+and circuit ground 56.

The buffer amplifier 64 has the capacity to source and sink current so that the output 68 therefrom—the driven shield signal 36—has substantially the same signal level as the input 62 thereto. The driven shield signal 36 is AC coupled through a coupling capacitor 70 to the heating element 34 of the seat heater 26 so as to electrically shield the sensor electrode 40 from its surroundings on the heating element 34 side thereof.

The output 68 of the buffer amplifier 64 is also operatively connected to a sensing circuit 42 that provides gain, band-pass filtering, signal detection, low-pass filtering, DC offset adjustment and DC gain so as to recover a DC signal responsive to the impedance of the electric field sensor 12, as is described in greater detail hereinbelow. The sensing circuit 42 provides a measure responsive to the impedance of the sensor electrode 40, and the output therefrom is operatively coupled to a controller 74 that determines a seat occupancy condition—e.g. occupant presence, type, size or position—from that measure and outputs either an enable signal or a disable signal to one input of an AND gate 76. The other input of the AND gate 76 is operatively connected to a crash detector 78 that detects whether or not the vehicle 16 has been involved in a crash of sufficient severity to warrant the deployment of a safety restraint actuator 80.

The sensor electrode 40 may shaped and located so as to be able to distinguish seating conditions for which a safety restraint actuator 80, for example an air bag inflator module, should be deployed from seating conditions for which the safety restraint actuator 80 should not be deployed so as to avoid causing more injury to an occupant than the occupant would otherwise incur without the deployment of the safety restraint actuator 80. For example, the sensor electrode 40 is shaped and located so that a capacitance of the at least one sensor electrode 40 with respect to a circuit ground 56 is substantially greater for a seating condition for which the safety restraint actuator 80 should be deployed, for example an occupant seated in substantially normal seating position on the seat 14 or a large body immediately above the seat bottom 18; than for a seating condition for which the safety restraint actuator 80 should not be deployed, for example an empty seat 14, an infant, child, or booster seat on the seat 14 with or without an infant or child seated therein, or an occupant on the seat 14 in a position that is substantially different from a normal seating position. The sensor electrode 40 is, for example, substantially the same size as a region to be sensed on the seat 14, and sections of the sensor electrode 40 may be removed to selectively reduce the sensitivity thereof proximate to regions where an infant or child, in an infant, child, or booster seat, is closest to the seat 14.

The sensor electrode 40 may be constructed in a variety of ways, and the method of construction is not considered limiting. For example, an electrode may be constructed using rigid circuit board or a flexible circuit using known printed circuit board techniques such as etching or deposition of conductive materials applied to a dielectric substrate. Alternately, an electrode may comprise a discrete conductor, such as a conductive film, sheet or mesh that is distinct from or an integral part of the seat 14 or components thereof. The assembly of one or more electrodes together with the associated substrate is sometimes referred to as a sensing pad or a capacitive sensing pad.

In operation, the signal generator 55 generates an oscillatory or pulsed applied signal 38 that is applied across the AC voltage divider 58 comprising the bridge capacitor 54 and the sensor electrode 40. A sensed signal 44 at the node 60 of the AC voltage divider 58 is buffered by the buffer amplifier 64 which outputs a driven shield signal 36 of substantially the same magnitude and phase as the sensed signal 44. The driven shield signal 36 is applied through a coupling capacitor 70 to the heating element 34 of a seat heater 26 proximate to and below the sensor electrode 40 in the seat 14. The first 50 and second 52 inductors choke the driven shield signal 36 so as to prevent either the source of power 46 to or the sink of power 48 from the seat heater 26 from excessively loading the buffer amplifier 64. The applied signal 38 coupled to the sensor electrode 40 causes the sensor electrode 40 to generate an electric field that couples with the surroundings thereof. The driven shield signal 36 applied to the heating element 34 substantially nulls the electric field between the sensor electrode 40 and the heating element 34, which substantially isolates the sensor electrode 40 from influence by portions of the seat 14 on the same side as the seat heater 26 relative to the sensor electrode 40.

An occupant seated on the seat 14 increases the capacitance of the sensor electrode 40, which decreases the capacitive reactance thereof so as to reduce the magnitude of the sensed signal 44 at the node 60 of the AC voltage divider 58. The sensed signal 44 is operatively coupled to the sensing circuit 42 through the buffer amplifier 64. The sensing circuit 42 conditions and detects a measure responsive to the impedance of the sensor electrode 40, from which the controller 74 detects the associated seat occupancy condition. If the seat occupancy condition warrants the actuation of a safety restraint actuator 80 responsive to a crash—e.g. for a normally seated adult occupant for which the associated capacitance is greater than a threshold—then the controller 74 outputs an enable signal (TRUE) to the AND gate 76. Otherwise—e.g. for an out-of-position occupant, a physically small occupant, or rear-facing-infant seat for which the associated capacitance is less than a threshold—the controller 74 outputs a disable signal (FALSE) thereto. For the example of a safety restraint actuator 80 comprising an air bag inflator module, responsive to a crash detected by the crash detector 78, if an occupant is seated on the seat 14, an actuation signal from the controller 42 is operatively coupled to one or more initiators of one or more gas generators mounted in the air bag inflator module, thereby controlling the actuation of the air bag inflator module 42 so as to inflate an associated air bag 60 as necessary to protect the occupant from injury which might otherwise be caused by the crash. The electrical power necessary to carry out these operations is provided by a source of power 46, for example, the vehicle battery.

The above-described circuitry may be either integrated in one module, or embodied in a plurality of modules. For example, the sensing circuit 42 and controller 74 may be combined with the signal generator 55 and other circuit elements in a single module that provides all of the above described functions. This single module may further incorporate the crash detector 78. Alternately, the controller 74 and/or crash detector 78 may be embodied as a separate element or as separate elements that communicate with the remaining circuit elements in a separate module.

Figure 2:
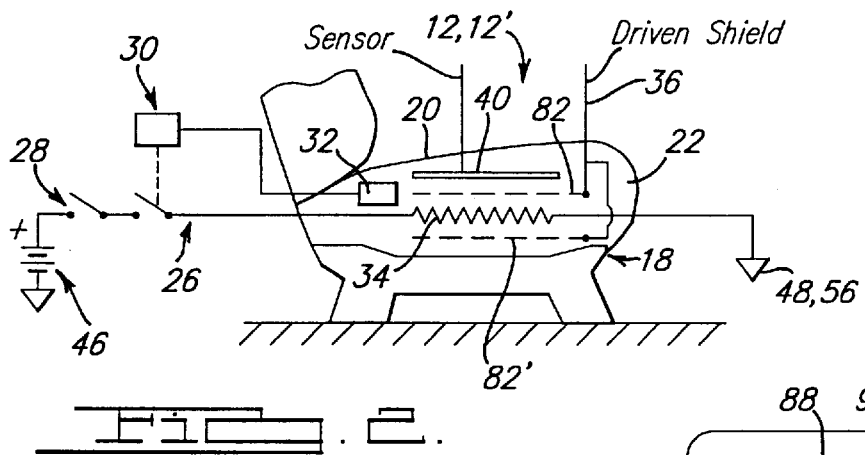
FIG. 2 illustrates another embodiment of an occupant sensor in a seat with a seat heater.

Referring to FIG. 2, another method of mitigating the influence of a heating element 34 on a capacitive sensor 12' is to shield the conductor of the heating element 34 with a conductive shield 82 located between the heating element 34 and the sensor electrode 40, wherein the conductive shield 82 is driven by a driven shield signal 36. The conductive shield 82, 82' may also be adapted to surround the heating element 34, similar to how the shield of a coaxial cable surrounds the center conductor. The heating element 34, for example, in the form of a heating cable, may be surrounded by a conductive sheath that is operatively coupled to the driven shield signal 36.

Figure 3:
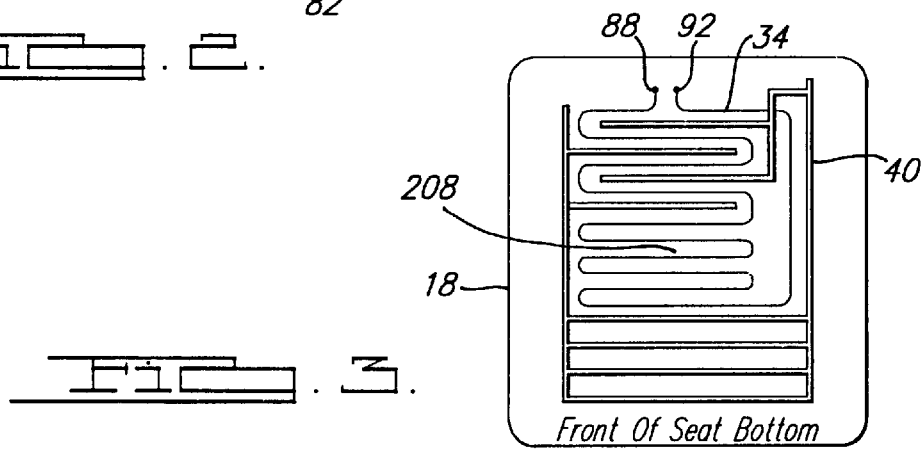
FIG. 3 illustrates a plan view of a sensor electrode and a heating element of a seat heater in a seat bottom.

For either of the configurations illustrated in FIGS. 1 and 2, the sensor electrode 40 is located either between the occupant seating area and the heating element 34, or, as illustrated in FIG. 3, is inter-digitized on a common substrate with the heating element 34, so that the sensor electrode 40 is not shielded from the occupant by the heating element 34.

Figure 4:
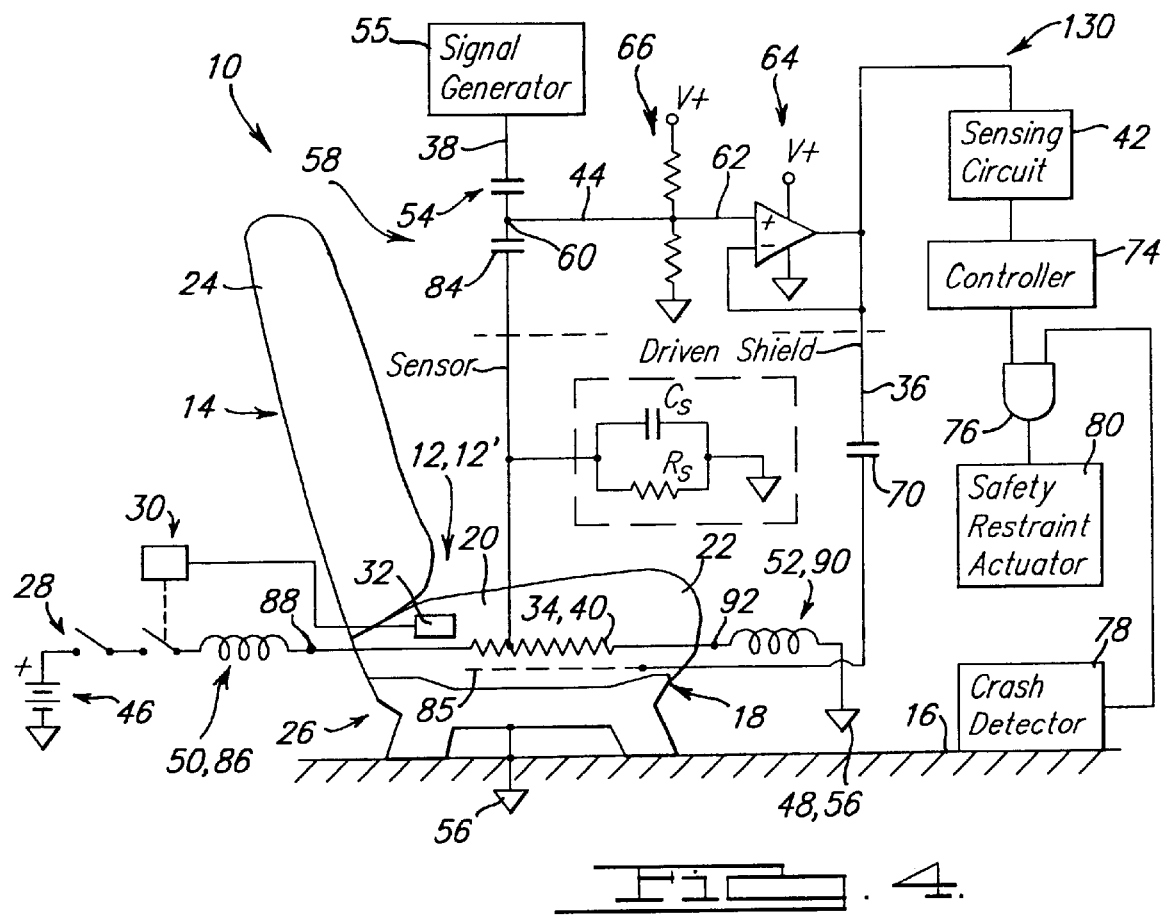
FIG. 4 illustrates yet another embodiment of an occupant sensor in a seat with a seat heater.

Referring to FIG. 4, the above-described system of FIG. 1 may be modified to utilize the conductive heating element 34 of the seat heater 26 as the sensor electrode 40 of the electric field sensor 12, wherein the heating element 34 is AC coupled to the node 60 of the AC voltage divider 58 by a coupling capacitor 84 so that the DC offset from the heater element does not affect the resulting sensor measurement. In this case, the driven shield signal 36 is not separately coupled to the heating element 34 as in the embodiment of FIG. 1. The coupling capacitor 84 preferably has a capacitance at least ten times larger than the capacitance of the sensor electrode 40 to ground so that the effect thereof on the AC voltage divider 58 output is relatively small. This circuit becomes practical when the frequencies used to make the measurement are for example above 1 MHz (and preferably above 10 MHz)—depending upon the cost and size of inductors—such that the inductance of the inductors can be less than 100 micro-Henries.

A driven shield 85 may be provided on the side of the heating element 34 away from the seating area, which when operatively coupled to the driven shield signal 36 would substantially reduce the coupling of the applied signal 38 to that portion of the seat that is away from the seating area.

In operation, the signal generator 55 generates an oscillatory or pulsed applied signal 38 that is applied across the AC voltage divider 58 comprising the bridge capacitor 54 and the AC coupled heating element 34 that acts as sensor electrode 40. A sensed signal 44 at the node 60 of the AC voltage divider 58 is buffered by the buffer amplifier 64. The first 50 and second 52 inductors choke the driven shield signal 36 so as to prevent either the source of power 46 to or the sink of power 48 from the seat heater 26 from substantially influencing the capacitance of the sense electrode 40. The applied signal 38 coupled to the heating element 34 causes the heating element 34 to generate an electric field that couples with the surroundings thereof.

An occupant seated on seat 14 increases the capacitance of the heating element 34, which decreases the capacitive reactance thereof so as to reduce the magnitude of the sensed signal 44 at the node 60 of the AC voltage divider 58. The sensed signal 44 is operatively coupled to the sensing circuit 42 through the buffer amplifier 64, and is subsequently processed and used as described hereinabove for the embodiment of FIG. 1.

Whereas FIGS. 1 and 4 illustrate the input of the the sensing circuit 42 as being operatively coupled to the output 68 of the buffer amplifier 64, it should be understood that the input of the the sensing circuit 42 could alternately be operatively connected to the input 62 thereof.

Figure 5:
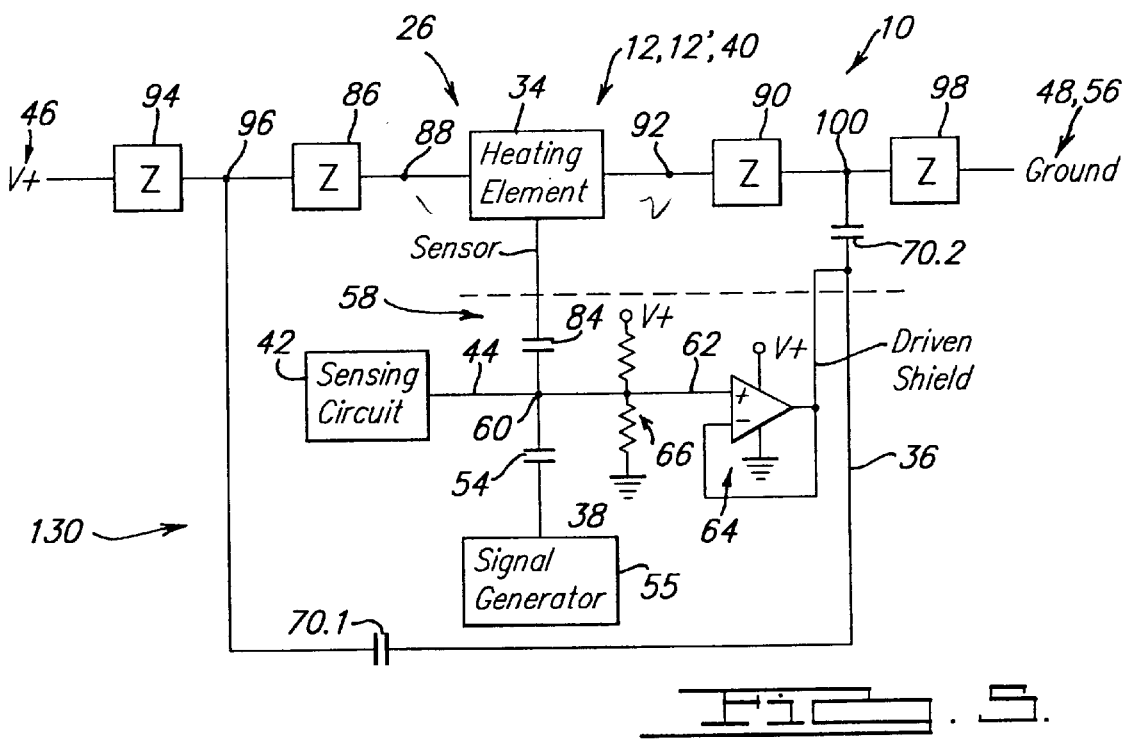
FIG. 5 illustrates yet another embodiment of an occupant sensor in a seat with a seat heater.

Referring to FIG. 5, in accordance with another embodiment, the heating element 34 is used as the sensor electrode 40 and a driven shield signal 36 is used to electrostatically isolate the sensor electrode 40 from both the source of power 46 and the sink of power 48 that are used to power the seat heater 26. As with the embodiments illustrated in FIGS. 1 and 4, a first impedance 86 is operatively connected between a first node 88 of the heating element 34 and the source of power 46 (e.g. vehicle battery); and a second impedance 90 is operatively connected between a second node 92 of the heating element 34 and the sink of power 48 (e.g. vehicle ground). Further to the embodiments illustrated in FIGS. 1 and 4, a third impedance 94 is operatively connected between the first impedance 86 and the source of power 46, wherein the first impedance 86 and the third impedance 94 are operatively connected in series with one another at a third node 96. Moreover, a fourth impedance 98 is operatively connected between the second impedance 90 and the sink of power 48, wherein the second impedance 90 and the fourth impedance 98 are operatively connected in series with one another at a fourth node 100. As with the embodiment illustrated in FIG. 4, an oscillatory or pulsed applied signal 38 is generated by a signal generator 55 and applied to the sensor electrode 40 through a bridge capacitor 54 of an AC voltage divider 58, and through a coupling capacitor 84; and the resulting sensed signal 44 at the node 60 of the AC voltage divider 58 is operatively connected to a sensing circuit 42 and to a buffer amplifier 64 that provides a driven shield signal 36 at the output thereof. The driven shield signal 36 is AC coupled through respective coupling capacitors 70.1, 70.2 to the third 96 and fourth 100 nodes, which electrostatically shields the heating element 34 from the source of power 46 and the sink of power 48 respectively. Both sides of the first 88 and second 90 impedances are each respectively driven at substantially the same signal level, so that substantially no current flows therethrough responsive to the applied 38 and driven shield 36 signals. The third 94 and fourth 98 impedances are each adapted to choke or block current responsive to the driven shield 36 signal to or from the source 46 or sink 48 of power respectively. Accordingly, the sensor electrode 40 is substantially electrostatically isolated from the source 46 or sink 48 of power, and is principally responsive to electric-field-influencing media, such as an occupant, proximate thereto. The first 86, second 90, third 94 and fourth 98 impedances comprise circuit elements that have a relatively low impedance to the source of power 46, e.g. a DC power supply, but which either have a relatively high impedance to a signal generated by the signal generator 55, either continuously or intermittently. Examples of circuit elements exhibiting this property include inductors, and electronic switches such as field-effect transistors, as illustrated in the embodiments of FIGS. 6 and 7 respectively.

Figure 6:
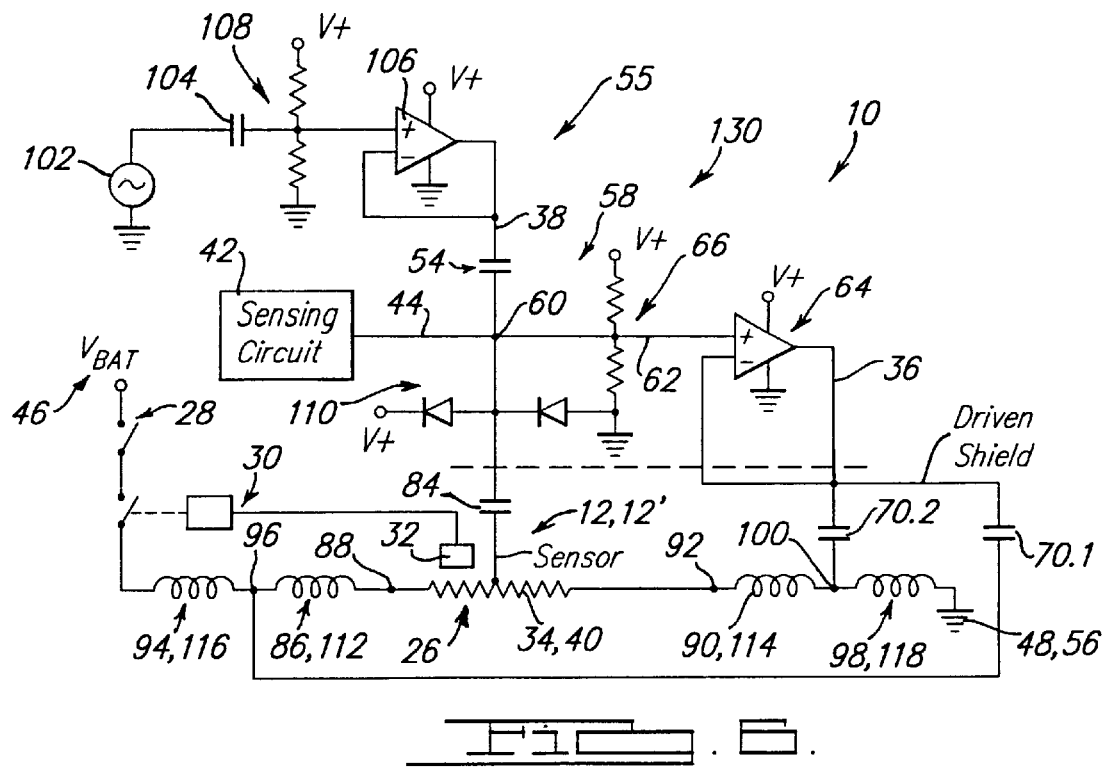
FIG. 6 illustrates yet another embodiment of an occupant sensor in a seat with a seat heater.
Figure 7:
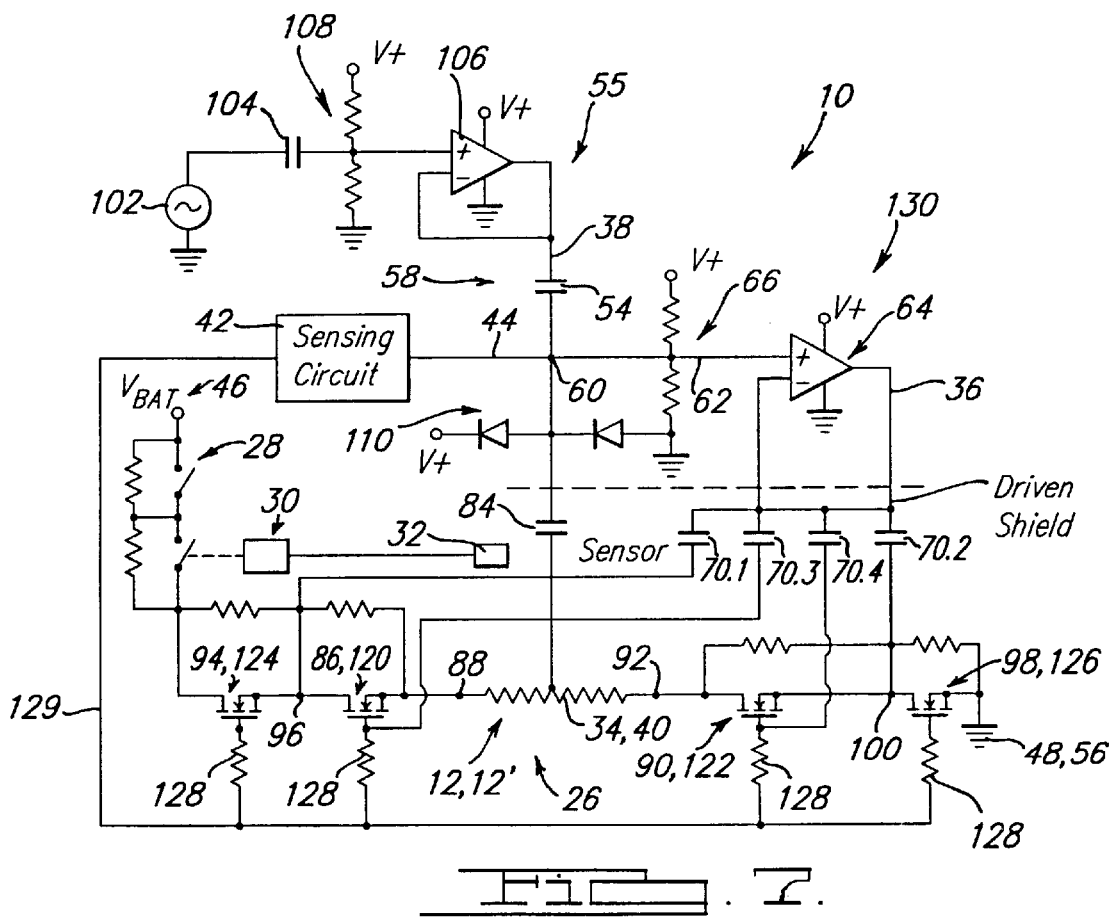
FIG. 7 illustrates yet another embodiment of an occupant sensor in a seat with a seat heater.

Referring to FIGS. 6 and 7, which illustrate examples of particular embodiments of the generalized circuit illustrated in FIG. 5, the signal generator 55 comprises an oscillator 102 that is AC coupled through a coupling capacitor 104 to a buffer amplifier 106, the input of which is DC biased by a DC voltage divider 108. A pair of diodes 110 operatively connected to the node 60 of the AC voltage divider 58 clip the noise signal level so as to not exceed a range bounded by the power supply voltage V+ and ground.

Referring to FIG. 6, the first 86, second 90, third 94 and fourth 98 impedances are provided by inductors 112, 114, 116 and 118 respectively, each having 1) a current carrying capacity sufficient to handle the current necessary to power the seat heater 26, 2) a relatively low DC impedance, and 3) a relatively high impedance at the frequency of the oscillator 102.

Referring to FIG. 7, the first 86, second 90, third 94 and fourth 98 impedances are provided by field-effect transistors 120, 122, 124 and 126 respectively each having a sufficient current carrying capacity to handle the current necessary to power the seat heater 26. The respective gates of the field-effect transistors 120, 122, 124 and 126 are driven through respective resistors 128 by a control signal 129 from the sensing circuit 42, wherein the control signal 129 at a low level turns the field-effect transistors 120, 122, 124 and 126 OFF when sensing the sensed signal 44, and, at a high level, otherwise turns the field-effect transistors 120, 122, 124 and 126 ON to enable the seat heater 26 to generate heat when both the ON-OFF switch 28 and the thermostatically controlled relay are activated. The field-effect transistors 120, 122, 124 and 126 are generally characterized by associated gate-source and gate-drain capacitances, that unless otherwise compensated, could act to bypass a portion of the applied signal 38 through associated gate control circuits. This problem can substantially eliminated by AC coupling the driven shield signal 36 to the respective gates of the field-effect transistors 120, 122 associated with the first 86 and second 90 impedances, wherein the source, drain and gate of each respective field-effect transistor 120, 122 are driven at substantially the same AC signal level, which accordingly should not cause these field-effect transistor 120, 122 to either turn on or off responsive thereto. The resistors shown between the source and drain of the respective field-effect transistors 120, 122, 124 and 126, and across the ON-OFF switch 28 and the switch controlled by the thermostat 32 provide a D.C. reference for the control signal 129 to the gates of the respective field-effect transistors 120, 122, 124 and 126.

In accordance with another embodiment, the first 86 and second 90 impedances could be embodied by respective field-effect transistors 120 and 122 as described hereinabove with reference to FIG. 7, and the third 94 and fourth 98 impedances could be embodied by respective inductors 116 and 118 as described hereinabove with reference to FIG. 6. Alternately, the first 86 and second 90 impedances could be embodied by respective inductors 112 and 114 as described hereinabove with reference to FIG. 6, and the third 94 and fourth 98 impedances could be embodied by respective field-effect transistors 124 and 126 as described hereinabove with reference to FIG. 7.

For purposes of illustration, and by way of example only, an electric-field-sensor circuit 130 was constructed incorporating a bridge capacitor 54 having a capacitance of 54 pico-Farads, and a coupling capacitor 84 having a capacitance of 0.01 micro-Farads. The frequency of the applied signal 38 is adapted to be sufficiently high such that the associated capacitive reactance Z(Cs) of the sensor electrode 40 is substantially less than the resistance Rs thereof, for example, greater than or equal to 400 kilo-Hertz. With a 400 kilo-Hertz sinusoidal applied signal 38, inductors 112, 114, 116 and 118 having respective inductances of 100 micro-Henries or less can provide sufficient isolation for the embodiments illustrated in FIGS. 1, 5 and 6. The embodiment illustrated in FIG. 4 would possibly incorporate either a higher operating frequency, larger inductance values, or both. The output impedance of the buffer amplifier 64 providing the driven shield signal 36 is, for example, relatively low compared with the associated first 86, second 90, third 94 or fourth 98 impedances, the later of which depend upon the frequency of the applied signal 38.

The above-described system and method for co-locating a capacitive sensor with a heater element can also be applied when co-locating a capacitive sensor with other sensors below the occupant, including weight sensors (load cells and force sensitive resistors), and pressure pattern sensors (force sensitive resistors and bend sensors). For example, the capacitive sensor in the seat bottom could be integrated with either a force sensing resistors sensor or a bend sensor using a common sensing mat, pad or substrate.

The sensing circuit 42 illustrated FIGS. 1, 4, 5, 6 and 7 is part of a larger circuit that will be referred to herein as an electric-field-sensor circuit 130, wherein the latter includes for example the signal generator 55, AC voltage divider 58, buffer amplifier 64, sensing circuit 42, and other related components. FIGS. 8a, 8b, 9a, 9b, 10 and 11 illustrate various embodiments of the electric-field-sensor circuit 130, which are now described in further detail, wherein the labels SENSOR and DRIVEN SHIELD are used to indicate common signal locations where the electric-field-sensor circuits 130, or portions thereof, of FIGS. 8a, 8b, 9a, 9b, 10 and 11 would interface with the systems illustrated in FIGS. 1, 4, 5, 6 and 7.

The temperature range that is possible in an automotive environment can potentially adversely affect the electric-field-sensor circuit 130, causing a drift in the "perceived" sensor reading. One simple way to combat this drift is to use a reference capacitor that can be switched into the measurement circuit in place of the sensing electrode. Because the reference capacitor can be selected such that its value is relatively stable over temperature, drift can be identified and this information can be used to alter a decision threshold. An alternative scheme is to always measure the difference between a reference capacitor and the sensor capacitance. A second "calibration" capacitor can then be switched in to take the place of the sensor to identify the measurement system gain. Using a reference capacitor and a calibration capacitor allows the system to continuously compensate for variations in the measurement circuit. Rather than attempting to measure the temperature and then make a correction, the reference and calibration capacitor are used to measure the current offset and gain of the measurement circuitry so that measurements are always consistent. Switching between the reference capacitor, the calibration capacitor, or a sensor can be done using a combination of FET's or an analog demultiplexor such as a CD4051 from Texas Instruments.

The capacitance of the sensor electrode 40 relative to circuit ground 56 is relatively small, for example less than about 300 pico-Farads. The temperature range that is possible in an automotive environment can significantly affect the components of the electric-field-sensor circuit 130, causing drift that can be erroneously interpreted as a measurement that could enable the safety restraint actuator 80 to be erroneously enabled by the controller 74. The effects of this drift can be mitigated by incorporating a temperature stable reference capacitor in the electric-field-sensor circuit 130 that is switched in place of the sensor electrode 40 so as to provide a means for making comparative capacitive measurements. Since the reference capacitor can be selected such that its value is very stable over temperature, drift can be identified and quantified, and this information can be used to alter a decision threshold, for example responsive to a drift in circuit elements of the electric-field-sensor circuit 130 with respect to temperature or time.

Figure 8:
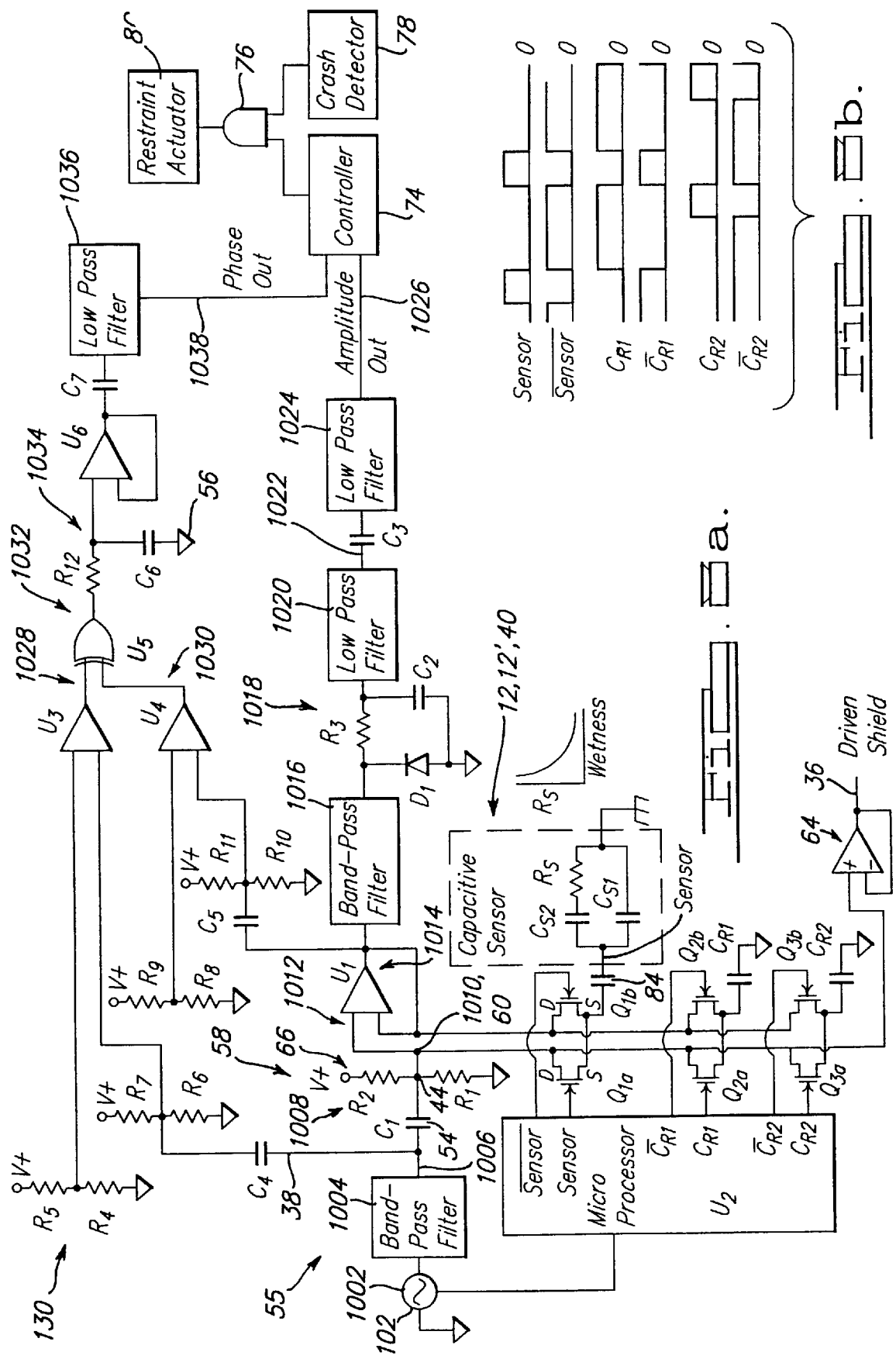

Referring to FIG. 8a, illustrating an exemplary electric-field-sensor circuit 130, an oscillator 1002 generates an oscillating signal, for example a sinusoidal signal, that is filtered by a first bandpass filter 1004 so as to create a first oscillating signal 1006. The first oscillating signal 1006 is applied to a capacitive voltage divider 1008 comprising capacitor C1, resistors R1 and R2, and one or more capacitive elements to be measured, selected from the group consisting of the sensor electrode 40, comprising at least one sensor electrode 40, a first reference capacitor CR1, and a second reference capacitor CR2, wherein the capacitive elements to be measured are included or excluded responsive to the states of respective FET switches Q1a, Q1b, Q2a, Q2b, Q3a, and Q3b. Capacitor C1, resistors R1 and R2, and the FET switches Q1a, Q2a, and Q3a—that when active switch in the respective capacitive elements to be measured,—are all connected to one another at a first node 1010, which is connected to the input 1012 of a voltage follower U1. The output 1014 of the voltage follower U1 is operatively coupled to FET switches Q1b, Q2b, and Q3b that when active, switch out the respective capacitive elements so as to not be measured. The activation of the FET switch elements of FET switch pairs Q1a and Q1b, Q2a and Q2b, and Q3a and Q3b are respectively mutually exclusive. For example, if FET switch Q1a is activated, or closed, then FET switch Q1b is deactivated or open. A capacitive element being measured adds to the capacitance at the first node, thereby affecting the strength of the signal at the input 1012 to the voltage follower U1. A capacitive element not being measured is disconnected from the first node by its respective first FET switch element, and connected to the output 1014 of the voltage follower U1 by its respective second FET switch element, wherein, in accordance with the characteristics of the associated operational amplifier of the voltage follower U1, the output 1014 of the voltage follower U1 follows the signal of the first node without that respective capacitive element connected, and voltage follower U1 provides a current through the associated capacitive element through the second respective FET switch element. Moreover, when the respective second FET switch element is activated, the source and drain of the respective first FET switch element are separately coupled to the respective operational amplifier inputs, so that to each is applied the same potential, thereby eliminating the effect of the capacitance of the respective first FET switch on the capacitance measurement.

The output 1014 of the voltage follower U1 is then coupled to a second bandpass filter 1016 of the same pass band as the first bandpass filter 1004, the output of which is detected by a detector 1018 comprising diode D1, resistor R3 and capacitor C2, and filtered by a first low pass filter 1020. The output 1022 of the first low pass filter 1020 has a DC component corresponding to the capacitance at the first node 1010. This DC component is optionally filtered by an optional blocking capacitor C3, and the resulting signal is filtered by a second low pass filter 1024 to provide an amplitude signal 1026 representative of the amplitude of the oscillating signal at the first node 1010, which is related to the total capacitance at that location. The blocking capacitor C3 is adapted so as to provide for a transitory measurement of the amplitude signal 1026.

The first oscillating signal 1006 is also operatively coupled to a first comparator U3 that generates a first square wave signal 1028 with a duty cycle of, for example, about 50 percent. The output 1014 of the voltage follower U1 is also operatively coupled to a second comparator U4 that generates a second square wave signal 1030 with a duty cycle of, for example, about 50 percent. The first 1028 and second 1030 square wave signals are operatively coupled to a logical exclusive OR gate, which, for first 1028 and second 1030 square wave signals each of 50 percent duty cycle, provides a third square wave signal 1032 having a duty cycle that varies with the phase difference between the first oscillating signal 1006 and the output 1014 of the voltage follower U1, where in the duty cycle varies between 0 and 100 percent as the phase difference varies between 0 and 180 degrees. The third square wave signal 1032 is filtered by a third low pass filter 1034, the output of which is buffered by voltage follower U6. A blocking capacitor C7 passes the AC component of the output from the voltage follower U6, which is filtered by a fourth low pass filter 1036, so as to provide a phase signal 1038 representative of the phase shift to the first oscillating signal 1006 caused by the elements that are operatively coupled to the first node 1010.

In operation, a microprocessor U2 controls the activation of FET switches Q1a, Q1b, Q2a, Q2b, Q3a, and Q3b, for example in accordance with the control logic illustrated in FIG. 8b. With the first reference capacitor CR1 switched in by microprocessor U2, i.e. with Q2a activated and Q2b deactivated, the controller measures a first amplitude and a first phase. Then with the second reference capacitor CR2 also switched in by microprocessor U2, the controller measures a second amplitude and a second phase corresponding to an incremental increase of capacitance at the first node by the capacitance of capacitor CR2. With this information, the controller can compute a sensitivity factor in Volts/pico-Farad from the amplitude measurements given the known values of capacitance of capacitors CR1 and CR2, and an associated sensitivity factor for phase from the phase measurements. Then, the microprocessor U2 switches out the first CR1 and second reference capacitor CR2, switches in the sensor electrode 40, measures a third amplitude and a third phase, and calculates the capacitance and associated phase of the sensor electrode 40 using the calculated sensitivity factors. The controller 74 compares this capacitance, and possibly the associated phase, with a threshold so as to discriminate a normally seated occupant from other seat occupancy conditions. In one embodiment, the phase and amplitude are used to compensate for seat wetness, and a compensated measure is compared with a threshold for purposes of occupant discrimination. If a normally seated occupant is present, the safety restraint actuator 80 is actuated responsive to the detection of a crash by the crash detector 78. Whereas FIG. 8a illustrates the microprocessor U2 and controller 74 as separate elements that communicate with one another, alternate arrangements are possible. For example, both may be combined in one controller, or the microprocessor may be adapted to sense the amplitude and phase measurements, calculate the capacitance of the capacitive sensing pad and adjust the associated phase measurement, and then output the capacitance value and associated phase measurement to the controller 74.

The sensor electrode 40, mounted in the seat 14, is modeled as a first capacitance CS1 in parallel with a series combination of a second capacitance CS2 and a resistance RS, wherein the resistance RS is inversely related to the wetness of the seat. The capacitance of the electric field sensor 12 is dominated by CS1 for a dry seat, but becomes affected by CS2 and RS as the wetness of the seat increases. The values of capacitance for capacitors C1, CR1, and CR2 are adapted to maximize the dynamic range of the capacitance measurement over the range of expected capacitances of the electric field sensor 12.

The capacitance of the electric field sensor 12 can be also measured by other means of measuring capacitance, as for example given in *the Standard Handbook for Electrical Engineers* 12$^{th}$ *edition*, D. G. Fink and H. W. Beaty editors, McGraw Hill, 1987, pp. 3–57 through 3–65 or in Reference Data for Engineers: Radio, Electronics, Computer, and Communications 7$^{th}$ edition, E. C. Jordon editor in chief, Howard W. Sams, 1985, pp. 12-3 through 12—12, both included herein by reference.

Figure 9:
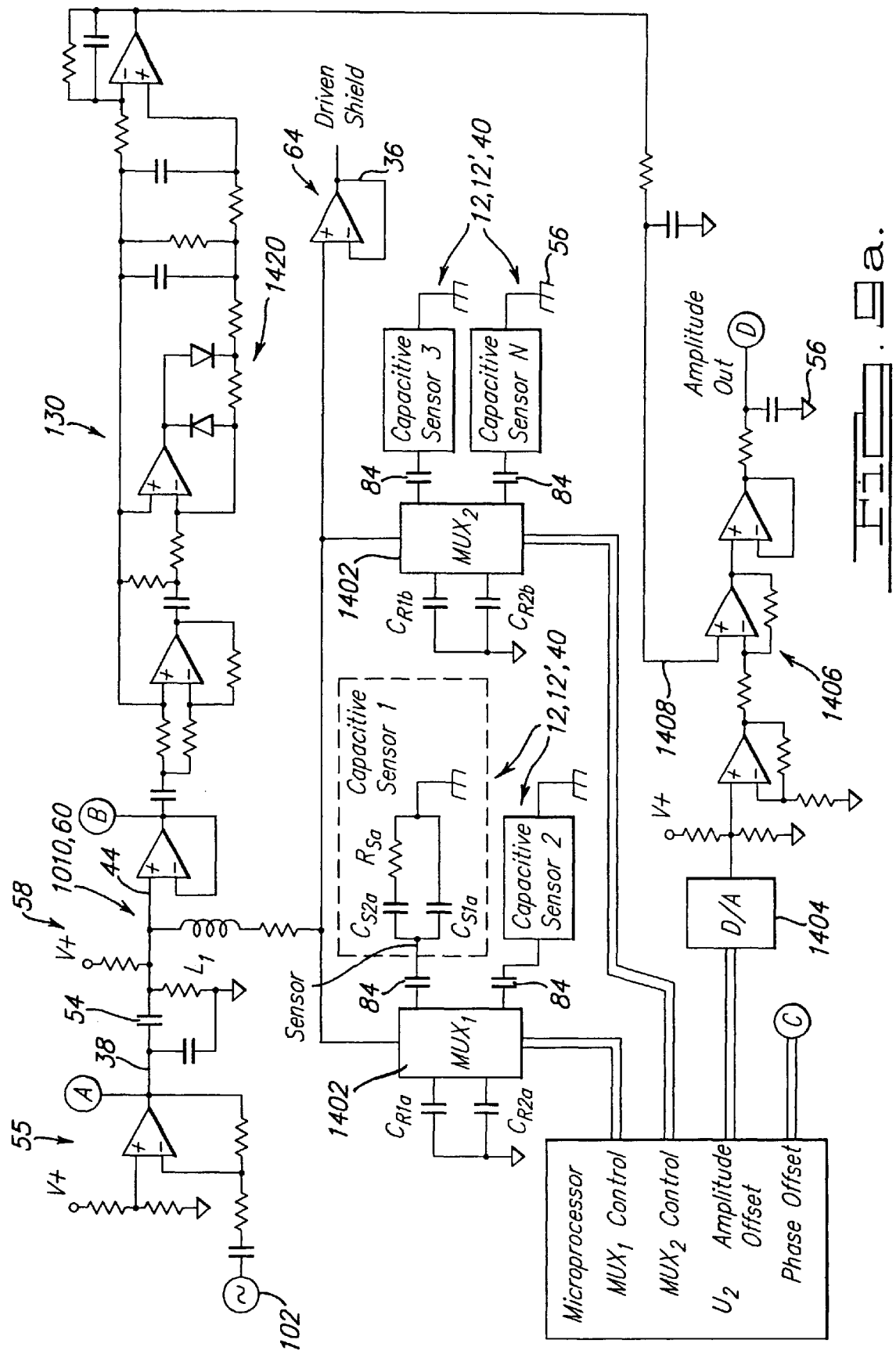
FIG. 9a and FIG. 9b illustrate a schematic diagram of another embodiment of a circuit for providing both amplitude and phase information from an electric field sensor.

FIGS. 9a and 9b illustrate several other embodiments for various aspects of the electric-field-sensor circuit 130, wherein FIG. 9a illustrates an amplitude sensing portion of the electric-field-sensor circuit 130 and FIG. 9b illustrates a phase sensing portion of the electric-field-sensor circuit 130, wherein the combination of amplitude and phase information can be used to account for seat wetness.

For example, the elements to be sensed at the first node 1010 can be coupled via an analog demultiplexor 1402, such as a CD4051 from Texas Instruments, wherein under control of the microprocessor U2, the elements to be sensed are coupled, one elements at a time, to the first node 1010 by the analog demultiplexor 1402. For example, first CR1*a* and second CR2*a* reference capacitors and a capacitive sensor are each operatively connected to distinct analog inputs of the analog demultiplexor 1402, and are operatively connected—mutually exclusively—to the first node 1010 by the analog demultiplexor 1402. Accordingly, with this arrangement, the calibration process differs from that illustrated in FIGS. 8*a*–*b* for which two reference capacitors can be simultaneously operatively connected to the first node 1010. A plurality of analog demultiplexors 1402 may be used if more analog channels are required, in which case a separate set of reference capacitors, for example CR1*b* and CR2*b*, may be used with each separate analog demultiplexor 1402 to compensate for variations amongst the various analog demultiplexors 1402.

As another example of an alternate embodiment, an inductor L1 can be placed between the sensing node 1010 and the elements to be sensed in order to reduce the effects of electromagnetic interference.

As yet another example of an alternate embodiment, a D/A converter 1404 under control of the microprocessor U2 may be used to cancel offsets in the associated amplitude signal, wherein the output from the D/A converter 1404 is operatively connected to an inverting amplifier 1406, and is subtracted from the filtered detected amplitude signal 1408. Similarly, a D/A converter 1410 under control of the microprocessor U2 may be used to cancel offsets in the associated phase signal, wherein the output from the D/A converter 1410 is operatively connected to an inverting amplifier 1412, and is subtracted from the filtered detected phase signal 1414. By canceling the respective offsets in the amplitude and phase signals, the associated circuit gains can be increased so as to increase the dynamic range of the respective signals.

As yet another example of an alternate embodiment, a logical OR gate 1416 may be used instead of an exclusive OR gate to form the third square wave signal 1418 representing the detected phase signal. The logical OR gate 1416 provides an inherent DC bias to the output signal, whereby for square wave input signals of 50 percent duty cycle, the output of the logical OR gate 1416 varies from 50 percent to full scale as phase difference varies from 0 to 180 degrees.

As yet another example of an alternate embodiment, a super diode detection circuit 1420 may be used for detecting the signal amplitude.

Figure 10:
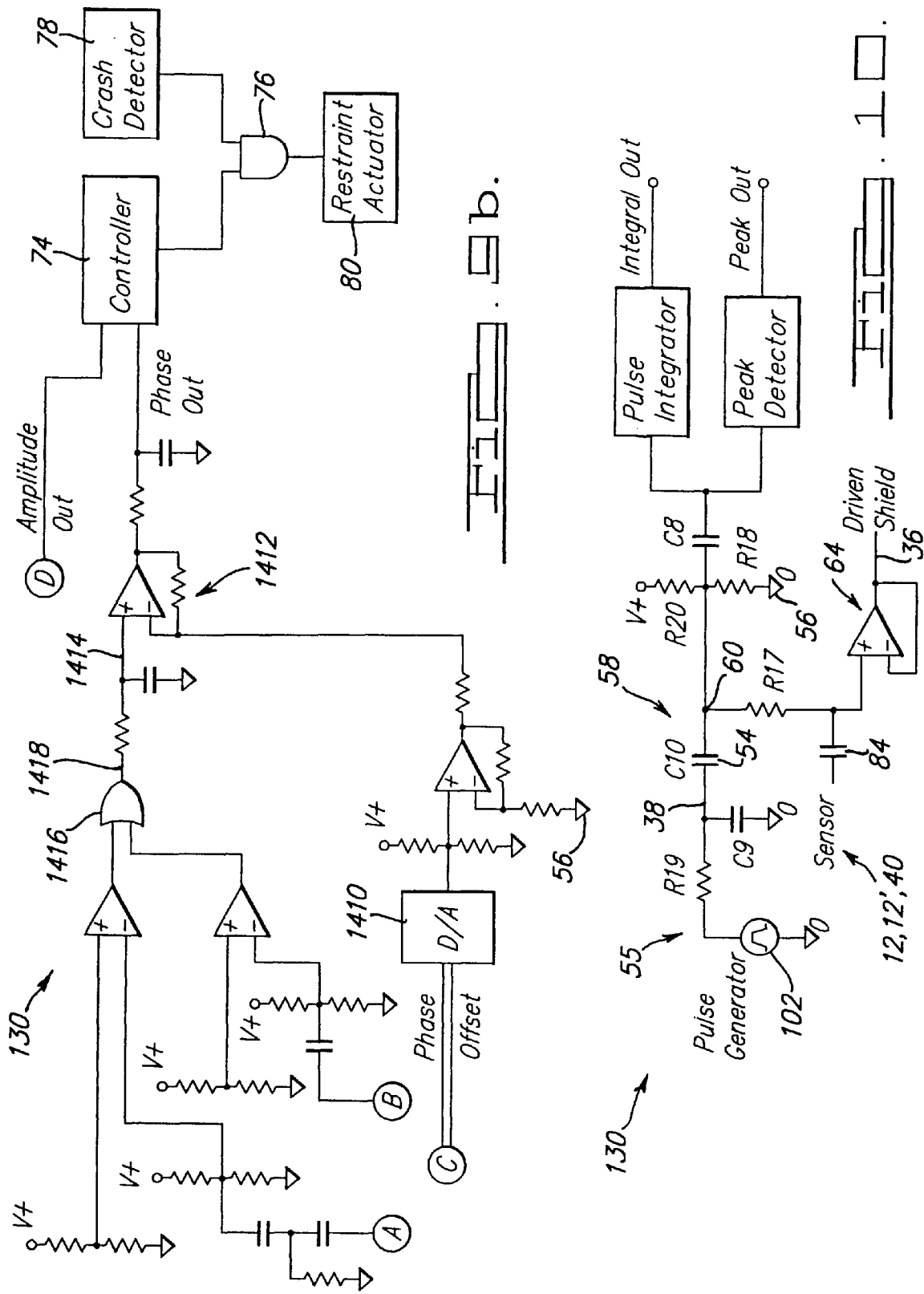
FIG. 10 illustrates a schematic diagram of an embodiment of a circuit for providing both integral and peak information from an electric field sensor using pulse excitation.

Another method for making a capacitance measurement that can similarly be used to account for seat wetness is to use a peak detector and integrator to identify characteristics of an isolated square pulse, as illustrated by the circuit shown in FIG. 10. The pulse generator sends a square wave pulse through a low pass filter which slows the rise of the pulse in order to reduce ringing that would otherwise result from the inductance of the sensor. When a pulse is sent into the bridge circuit comprising capacitor C10 and the at least one sensor electrode 40, the amplitude and shape of the pulse at the sensing node depends on the sensor's impedance to ground. Resistor R17 is a relatively small impedance (compared to either capacitor C10 or the sensor) and reduces the ringing after the rising edge. If the pulse length is short and the sensor is an ideal capacitor to ground, then the output will have essentially the same shape as the input pulse, but a lower amplitude. If the sensor has a complex impedance then the shape of the output pulse will vary depending on the components of the impedance. Conductance from the sensor to ground, as a result of resistance $R_s$ of the sensor electrode 40, causes a decreased amplitude and a decay of the voltage to ground. This decay can be used to identify the affect of water on the seat.

Figure 11:
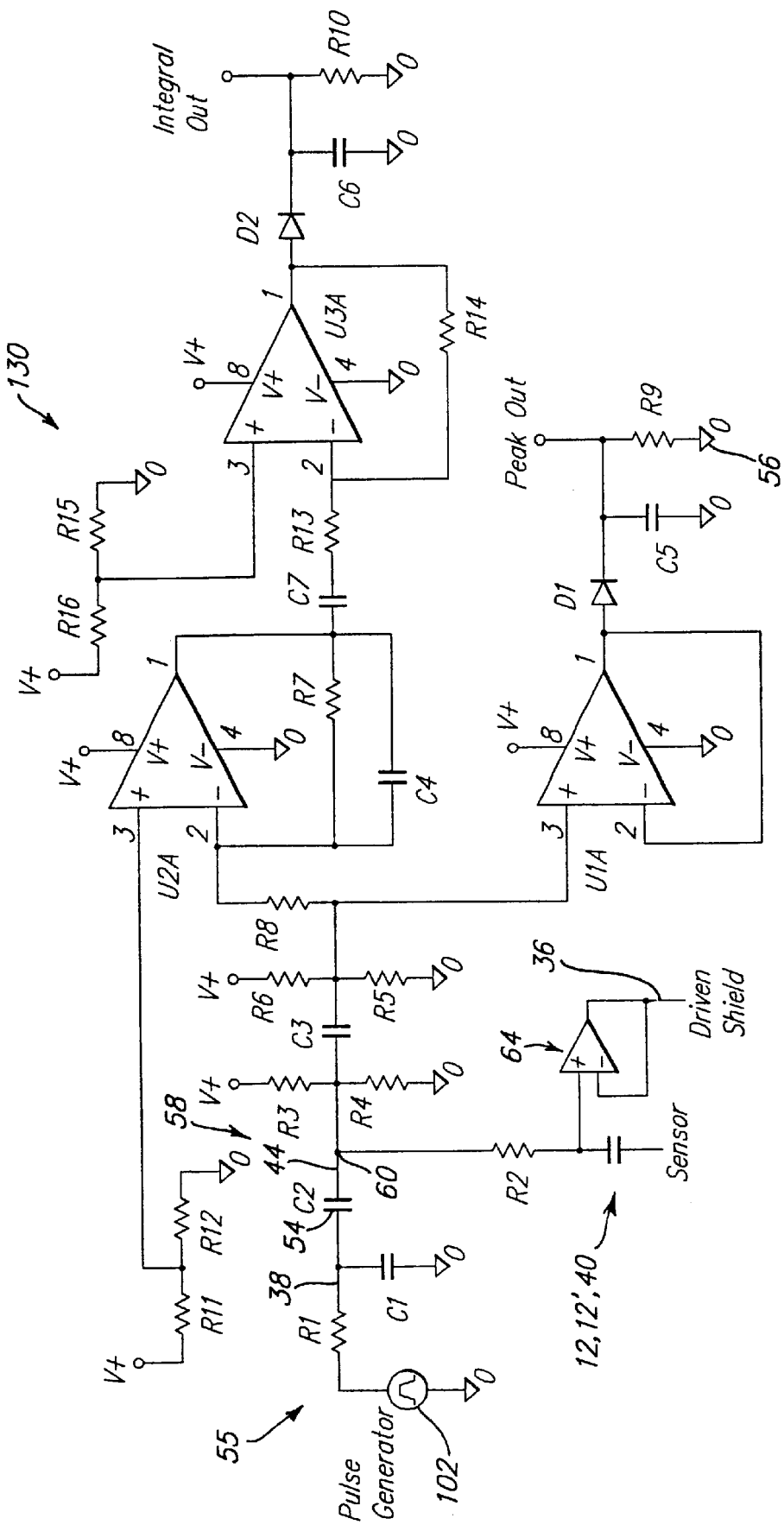
FIG. 11 illustrates a schematic diagram of another embodiment of a circuit for providing both integral and peak information from an electric field sensor using pulse excitation.

Characteristics of the output pulse, such as the peak and the integral, can be used to identify conductance to ground from the sensor, as illustrated by the circuit shown in FIG. 11. The input pulse is a TTL level square pulse that is filtered to increase the rise time of the leading positive edge. The setting of the rise time is a compromise between immunity to the wet seat condition and ringing in the signal as a result of the inductance at the sensor. Resistors can be placed in the measurement circuit to reduce this ringing.

Figure 12:
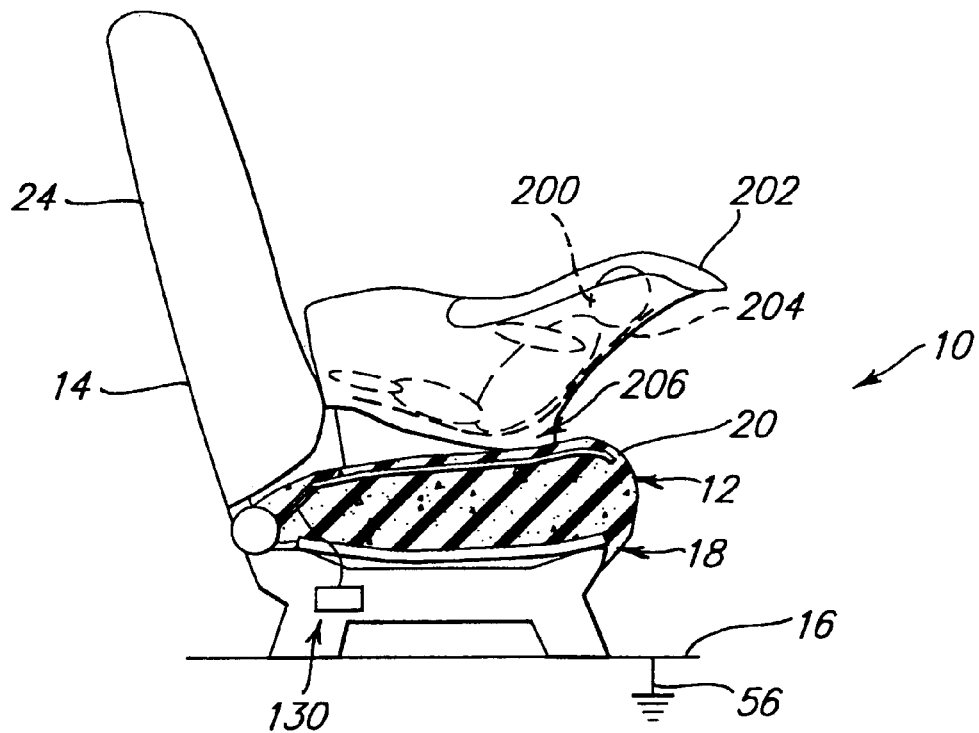
FIG. 12 illustrates a child in a typical rear facing infant seat placed on a vehicle seat.

Referring to FIG. 12, the occupant sensor 10 can be used to distinguish infants or children in rear facing infant seats, child seats or booster seats, from adults, on the basis that the child 200 therein does not have a large surface of its body very near to the seat bottom 18 and the sensor electrode 40 contained therein. For example, for the electric field sensor 12 providing a signal responsive to the capacitance of a sensor electrode 40 thereof, a normally seated occupant provides a substantially larger increase in capacitance relative to an empty seat, than does a rear facing infant seat 202. The occupant sensor can discriminate a rear facing infant seat 202 (RFIS), or generally a child seat, from an adult because the child 200 in a rear facing infant seat 202 does not have a large surface of its body very near to the seat bottom 18 and the sensor electrode 40 contained therein. The seating contour 204 inside the rear facing infant seat 202 is such that the buttocks of the child 200 are closest to the seat bottom 18 of the seat 14. Usually there is a significant gap 206, up to several inches, between the child 200 and the seat bottom 18 of the seat 14. Since child seats are typically made of plastic, the seats themselves are not sensed directly by the electric field sensor 12. Even for a rear facing infant seat 202 for which the gap 206 between the child 200 and the seat bottom 18 of the seat 14 is relatively small, the inside seating contour 204 still creates a significant gap between the at least one first electrode 26 and all parts of the child 200 except the buttocks. Since only a small portion of the surface of the child 200 is near to the sensor electrode 40, the capacitance measured by the electric field sensor 12 is relatively low, and more particularly, less than the threshold capacitance, $C_{norm}$ for detecting a normally seated adult occupant.

Referring to FIG. 3—illustrating an example of a sensor electrode 40 that is electrically isolated from the heating element 34 in accordance with the embodiments of the occupant sensor 10 illustrated in FIGS. 1 and 2—the sensor electrode 40 is arranged so as to define a electrode-less region of reduced sensitivity 208 located proximate to a portion of an infant or child that is closest to the seat 14 when the infant or child is seated in an infant, child, or booster seat, and the infant, child, or booster seat is placed on the seat 14. The sensor electrode 40 so adapted exhibits reduced sensitivity to an infant or child that is closest to the seat 14 when the infant or child is seated in an infant, child, or booster seat, and the infant, child, or booster seat is placed on the seat 14. Accordingly, the increase in capacitance responsive to a normally seated occupant seated on a seat 14 incorporating a sensor electrode 40 illustrated in FIG. 3 would be substantially greater than the corresponding increase in capacitance for an infant or child seated in an infant, child, or booster seat placed on the seat 14. For example, the electrode-less region of reduced sensitivity 208 may be located on the seat bottom 18 approximately 200 to 325 millimeters away from the seat back 24.

Figure 13:
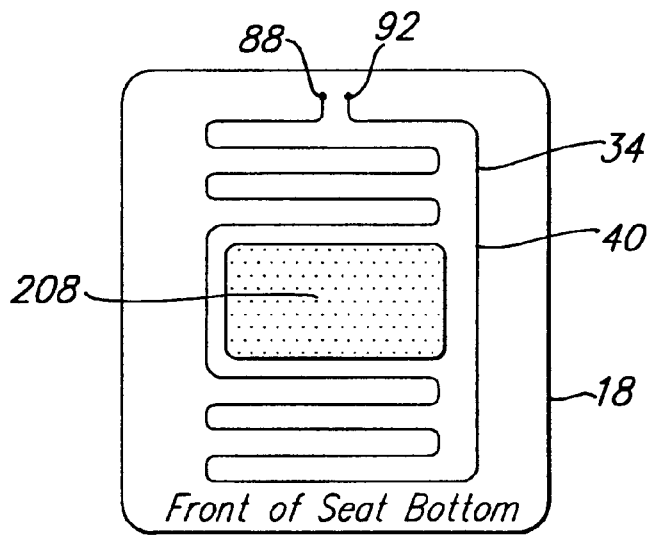
FIG. 13 illustrates a plan view of a heating element of a seat heater in a seat bottom, wherein the heating element is used as an electrode of an electric field sensor and is shaped for reduced sensitivity proximate a central region of the seat bottom.

Referring to FIG. 13—illustrating an example of a heating element 34 of a seat heater 26 utilized as a sensor electrode 40 in accordance with the embodiments of the occupant sensor 10 illustrated in FIGS. 4–7—the heating element 34 is arranged—similar to the sensor electrode 40 illustrated in FIG. 3, and with similar effect—so as to define an electrode-less region of reduced sensitivity 208 proximate to a central region of the seat bottom 18 located proximate to a portion of an infant or child that is closest to the seat 14 when the infant or child is seated in an infant, child, or booster seat, and the infant, child, or booster seat is placed on the seat 14.

One potential limitation with the arrangement illustrated in FIG. 13 is that the region of reduced sensitivity 208—illustrated as being void of a heating element 34—would receive less heat than portions of the seat 14 that incorporate the heating element 34.

An occupant sensor 10 utilizing a heating element 34 of a seat heater 26 as a sensor electrode 40, may be adapted to incorporate a region of reduced sensitivity 208, without affecting the distribution of heat, by shielding that portion of the heating element 34 within the region of reduced sensitivity 208 using an electrode located either between the heating element 34 and the seating region of the seat, or adjacent to the heating element 34, extended across the region of reduced sensitivity 208 and operatively coupled to the driven shield signal 36.

Whereas the occupant sensor 10 has been illustrated with a single seat heater 26 located in the seat bottom 18, in should be understood that the occupant sensor 10 may be adapted to cooperate with a plurality of seat heaters 26 in a seat 14, for example, separate seat heaters 26 in the seat bottom 18 and in the seat back 24. The respective heating elements 34 may either be incorporated in separate associated electric field sensors 12, with either distinct or shared associated circuit elements, or operatively connected to one another in a single combined electric field sensor 12.

While specific embodiments have been described in detail in the foregoing detailed description and illustrated in the accompanying drawings, those with ordinary skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

We claim:

1. A method of providing for sensing an occupant in a seat, wherein said seat incorporates a conductive heating element, said method comprising:
    a) providing for operatively connecting a first impedance between a first node of said heating element and a source of power;
    b) providing for operatively connecting a second impedance between a second node of said heating element and a sink of said power, wherein when a current is caused to flow between said first and second nodes by said source of power, said heating element generates heat;
    c) placing an electrode at a location either between said heating element and a seating region of said seat, or adjacent to said heating element;
    d) providing for operatively coupling a first signal to said electrode; and
    e) providing for operatively coupling a second signal to said heating element at a location at or between said first and second nodes, wherein said first signal is an oscillating or pulsed signal, said second signal is substantially equal to said first signal, said first impedance is or is made to be substantially greater responsive to said first signal than responsive to a signal causing said current, and said second impedance is or is made to be substantially greater responsive to said first signal than responsive to said signal causing said current.

2. A method of providing for sensing an occupant in a seat as recited in claim 1, wherein at least one of said first and second impedances is provided by at least one of respective first and second inductors.

3. A method of providing for sensing an occupant in a seat as recited in claim 1, wherein at least one of said first and second impedances is provided by at least one of respective first and second electronic switches.

4. A method of providing for sensing an occupant in a seat as recited in claim 3, further comprising providing for operatively coupling said second signal to at least one location selected from a control input of said first electronic switch and a control input of said second electronic switch.

5. A method of providing for sensing an occupant in a seat as recited in claim 1, wherein said operation of operatively coupling said first signal comprises AC coupling.

6. A method of providing for sensing an occupant in a seat as recited in claim 1, wherein said operation of operatively coupling said second signal comprises AC coupling.

7. A method of providing for sensing an occupant in a seat as recited in claim 1, further comprising providing for sensing the occupant from a response to said first signal.

8. A method of providing for sensing an occupant in a seat, wherein said seat incorporates a conductive heating element, said method comprising:
    a) providing for operatively connecting a first impedance between a first node of said heating element and a source of power;
    b) providing for operatively connecting a second impedance between a second node of said heating element and a sink of said power, wherein when a current is caused to flow between said first and second nodes by said source of power, said heating element generates heat, and at least one of said first and second impedances is provided by at least one of respective first and second inductors; and
    c) providing for operatively coupling a first signal to said heating element at a location at or between said first and second nodes, wherein said first signal is an oscillating or pulsed signal, said first impedance is or is made to be substantially greater responsive to said first signal than responsive to a signal causing said current, and said second impedance is or is made to be substantially greater responsive to said first signal than responsive to said signal causing said current.

9. A method of providing for sensing an occupant in a seat as recited in claim 8, further comprising:
    a) placing an electrode on a side of said heating element away from a seating region of said seat; and
    b) providing for operatively coupling a second signal to said electrode, wherein said second signal is substantially equal to said first signal.

10. A method of providing for sensing an occupant in a seat as recited in claim 9, wherein said operation of operatively coupling said second signal comprises AC coupling.

11. A method of providing for sensing an occupant in a seat as recited in claim 8, wherein said operation of operatively coupling said first signal comprises AC coupling.

12. A method of providing for sensing an occupant in a seat as recited in claim 8, further comprising providing for sensing the occupant from a response to said first signal.

13. A method of providing for sensing an occupant in a seat, wherein said seat incorporates a conductive heating element, said method comprising:
   a) providing for operatively connecting a first impedance between a first node of said heating element and a source of power;
   b) providing for operatively connecting a second impedance between a second node of said heating element and a sink of said power;
   c) providing for operatively connecting a third impedance between said first impedance and said source of power;
   d) providing for operatively connecting a fourth impedance between said second impedance and said sink of power, wherein when a current is caused to flow between said first and second nodes by said source of power, said heating element generates heat;
   e) providing for operatively coupling a first signal to said heating element at a location at or between said first and second nodes; and
   f) providing for operatively coupling a second signal to at least one location selected from a third node between said first and third impedances and a fourth node between said second and fourth impedances, wherein said first signal is an oscillating or pulsed signal, said second signal is substantially equal to said first signal, said first impedance is or is made to be substantially greater responsive to said first signal than responsive to a signal causing said current, said second impedance is or is made to be substantially greater responsive to said first signal than responsive to said signal causing said current, said third impedance is or is made to be substantially greater responsive to said first signal than responsive to a signal causing said current, and said fourth impedance is or is made to be substantially greater responsive to said first signal than responsive to said signal causing said current.

14. A method of providing for sensing an occupant in a seat as recited in claim 13, wherein at least one of said first and second impedances is provided by at least one of respective first and second inductors.

15. A method of providing for sensing an occupant in a seat as recited in claim 14, wherein at least one of said third and fourth impedances is provided by at least one of respective third and fourth inductors.

16. A method of providing for sensing an occupant in a seat as recited in claim 14, wherein at least one of said third and fourth impedances is provided by at least one of respective third and fourth electronic switches.

17. A method of providing for sensing an occupant in a seat as recited in claim 13, wherein at least one of said first and second impedances is provided by at least one of respective first and second electronic switches.

18. A method of providing for sensing an occupant in a seat as recited in claim 17, further comprising providing for operatively coupling said second signal to at least one location selected from a control input of said first electronic switch and a control input of said second electronic switch.

19. A method of providing for sensing an occupant in a seat as recited in claim 17, wherein at least one of said third and fourth impedances is provided by at least one of respective third and fourth inductors.

20. A method of providing for sensing an occupant in a seat as recited in claim 17, wherein at least one of said third and fourth impedances is provided by at least one of respective third and fourth electronic switches.

21. A method of providing for sensing an occupant in a seat as recited in claim 13, wherein said operation of operatively coupling said first signal comprises AC coupling.

22. A method of providing for sensing an occupant in a seat as recited in claim 13, wherein said operation of operatively coupling said second signal comprises AC coupling.

23. A method of providing for sensing an occupant in a seat as recited in claim 13, further comprising providing for sensing the occupant from a response to said first signal.

24. A method of sensing an occupant in a seat, wherein said seat incorporates a conductive heating element, said method comprising:
   a) operatively connecting a first impedance between a first node of said heating element and a source of power;
   b) operatively connecting a second impedance between a second node of said heating element and a sink of said power, wherein when a current is caused to flow between said first and second nodes by said source of power, said heating element generates heat;
   c) placing an electrode at a location either between said heating element and a seating region of said seat, or adjacent to said heating element;
   d) operatively coupling a first signal to said electrode;
   e) operatively coupling a second signal to said heating element at a location at or between said first and second nodes, wherein said first signal is an oscillating or pulsed signal, said second signal is substantially equal to said first signal, said first impedance is or is made to be substantially greater responsive to said first signal than responsive to a signal causing said current, and said second impedance is or is made to be substantially greater responsive to said first signal than responsive to said signal causing said current; and
   f) sensing a response to said first signal.

25. A method of sensing an occupant in a seat as recited in claim 24, wherein at least one of said first and second impedances is provided by at least one of respective first and second inductors.

26. A method of sensing an occupant in a seat as recited in claim 24, wherein at least one of said first and second impedances is provided by at least one of respective first and second electronic switches.

27. A method of sensing an occupant in a seat as recited in claim 26, further comprising operatively coupling said second signal to at least one location selected from a control input of said first electronic switch and a control input of said second electronic switch.

28. A method of sensing an occupant in a seat as recited in claim 24, wherein said operation of operatively coupling said first signal comprises AC coupling.

29. A method of sensing an occupant in a seat as recited in claim 24, wherein said operation of operatively coupling said second signal comprises AC coupling.

30. A method of sensing an occupant in a seat as recited in claim 24, further comprising controlling the actuation of a safety restraint system responsive to said response to said first signal.

31. A method of sensing an occupant in a seat, wherein said seat incorporates a conductive heating element, said method comprising:

a) operatively connecting a first impedance between a first node of said heating element and a source of power;

b) operatively connecting a second impedance between a second node of said heating element and a sink of said power, wherein when a current is caused to flow between said first and second nodes by said source of power, said heating element generates heat, and at least one of said first and second impedances is provided by at least one of respective first and second inductors;

c) operatively coupling a first signal to said heating element at a location at or between said first and second nodes, wherein said first signal is an oscillating or pulsed signal, said first impedance is or is made to be substantially greater responsive to said first signal than responsive to a signal causing said current, and said second impedance is or is made to be substantially greater responsive to said first signal than responsive to said signal causing said current; and d) sensing a response to said first signal.

32. A method of sensing an occupant in a seat as recited in claim 31, further comprising:

e) placing an electrode on a side of said heating element away from a seating region of said seat; and f) operatively coupling a second signal to said electrode, wherein said second signal is substantially equal to said first signal.

33. A method of sensing an occupant in a seat as recited in claim 32, wherein said operation of operatively coupling said second signal comprises AC coupling.

34. A method of sensing an occupant in a seat as recited in claim 31, wherein said operation of operatively coupling said first signal comprises AC coupling.

35. A method of sensing an occupant in a seat as recited in claim 31, further comprising controlling the actuation of a safety restraint system responsive to said response to said first signal.

36. A method of sensing an occupant in a seat, wherein said seat incorporates a conductive heating element, said method comprising:

a) operatively connecting a first impedance between a first node of said heating element and a source of power;

b) operatively connecting a second impedance between a second node of said heating element and a sink of said power;

c) operatively connecting a third impedance between said first impedance and said source of power;

d) operatively connecting a fourth impedance between said second impedance and said sink of power, wherein when a current is caused to flow between said first and second nodes by said source of power, said heating element generates heat;

e) operatively coupling a first signal to said heating element at a location at or between said first and second nodes;

f) operatively coupling a second signal to at least one location selected from a third node between said first and third impedances and a fourth node between said second and fourth impedances, wherein said first signal is an oscillating or pulsed signal, said second signal is substantially equal to said first signal, said first impedance is or is made to be substantially greater responsive to said first signal than responsive to a signal causing said current, said second impedance is or is made to be substantially greater responsive to said first signal than responsive to said signal causing said current, said third impedance is or is made to be substantially greater responsive to said first signal than responsive to a signal causing said current, and said fourth impedance is or is made to be substantially greater responsive to said first signal than responsive to said signal causing said current; and g) sensing a response to said first signal.

37. A method of sensing an occupant in a seat as recited in claim 36, wherein at least one of said first and second impedances is provided by at least one of respective first and second inductors.

38. A method of sensing an occupant in a seat as recited in claim 37, wherein at least one of said third and fourth impedances is provided by at least one of respective third and fourth inductors.

39. A method of sensing an occupant in a seat as recited in claim 37, wherein at least one of said third and fourth impedances is provided by at least one of respective third and fourth electronic switches.

40. A method of sensing an occupant in a seat as recited in claim 36, wherein at least one of said first and second impedances is provided by at least one of respective first and second electronic switches.

41. A method of sensing an occupant in a seat as recited in claim 40, further comprising operatively coupling said second signal to at least one location selected from a control input of said first electronic switch and a control input of said second electronic switch.

42. A method of sensing an occupant in a seat as recited in claim 40, wherein at least one of said third and fourth impedances is provided by at least one of respective third and fourth inductors.

43. A method of sensing-an occupant in a seat as recited in claim 40, wherein at least one of said third and fourth impedances is provided by at least one of respective third and fourth electronic switches.

44. A method of sensing an occupant in a seat as recited in claim 36, wherein said operation of operatively coupling said first signal comprises AC coupling.

45. A method of sensing an occupant in a seat as recited in claim 36, wherein said operation of operatively coupling said second signal comprises AC coupling.

46. A method of sensing an occupant in a seat as recited in claim 36, further comprising controlling the actuation of a safety restraint system responsive to said response to said first signal.

47. An occupant sensor for sensing an occupant in a seat, wherein said seat incorporates a conductive heating element, said occupant sensor comprising:

a) a first impedance operatively connecting a first node of said heating element to a source of power;

b) a second impedance operatively connecting a second node of said heating element to a sink of said power, wherein when a current is caused to flow between said first and second nodes by said source of power, said heating element generates heat;

c) an electrode located either between said heating element and a seating region of said seat, or adjacent to said heating element;

d) a first signal operatively coupled to said electrode; and e) a second signal operatively coupled to said heating element at a location at or between said first and second nodes, wherein said first signal is an oscillating or pulsed signal, said second signal is substantially equal to said first signal, said first impedance is or is made to be substantially greater responsive to said first signal than responsive to a signal causing said current, and said second impedance is or is made to be substantially greater responsive to said first signal than responsive to said signal causing said current.

48. An occupant sensor for sensing an occupant in a seat as recited in claim 47, wherein at least one of said first and second impedances is provided by at least one of respective first and second inductors.

49. An occupant sensor for sensing an occupant in a seat as recited in claim 47, wherein at least one of said first and second impedances is provided by at least one of respective first and second electronic switches.

50. An occupant sensor for sensing an occupant in a seat as recited in claim 49, wherein said second signal is operatively coupled to at least one location selected from a control input of said first electronic switch and a control input of said second electronic switch.

51. An occupant sensor for sensing an occupant in a seat as recited in claim 47, further comprising at least one first capacitor by which said first signal is operatively coupled.

52. An occupant sensor for sensing an occupant in a seat as recited in claim 47, further comprising at least one second capacitor by which said second signal is operatively coupled.

53. An occupant sensor for sensing an occupant in a seat as recited in claim 47, further comprising a means for sensing the occupant from a response to said first signal.

54. An occupant sensor for sensing an occupant in a seat as recited in claim 47, further comprising a means for controlling the actuation of a safety restraint system responsive to said first signal.

55. An occupant sensor for sensing an occupant in a seat, wherein said seat incorporates a conductive heating element, said occupant sensor comprising:
  a) a first impedance operatively connecting a first node of said heating element to a source of power;
  b) a second impedance operatively connecting a second node of said heating element to a sink of said power, wherein when a current is caused to flow between said first and second nodes by said source of power, said heating element generates heat; and
  c) a first signal operatively coupled to said heating element at a location at or between said first and second nodes, wherein said first signal is an oscillating or pulsed signal, said first impedance is or is made to be substantially greater responsive to said first signal than responsive to a signal causing said current, said second impedance is or is made to be substantially greater responsive to said first signal than responsive to said signal causing said current, said heating element is arranged so as to at least partially bound a region on a vehicle seat located proximate to a portion of an occupant selected from an infant or child that is closest to said seat when the infant or child is seated in an infant seat, a child seat, or a booster seat, and the infant seat, the child seat or the booster seat is placed on said vehicle seat, and said region is devoid of said heating element.

56. An occupant sensor for sensing an occupant in a seat, wherein said seat incorporates a conductive heating element, said occupant sensor comprising:
  a) a first impedance operatively connecting a first node of said heating element to a source of power;
  b) a second impedance operatively connecting a second node of said heating element to a sink of said power, wherein when a current is caused to flow between said first and second nodes by said source of power, said heating element generates heat, and at least one of said first and second impedances is provided by at least one of respective first and second inductors; and
  c) a first signal operatively coupled to said heating element at a location at or between said first and second nodes, wherein said first signal is an oscillating or pulsed signal, said first impedance is or is made to be substantially greater responsive to said first signal than responsive to a signal causing said current, and said second impedance is or is made to be substantially greater responsive to said first signal than responsive to said signal causing said current.

57. An occupant sensor for sensing an occupant in a seat as recited in claim 56, further comprising:
  a) an electrode located on a side of said heating element away from a seating region of said seat; and
  b) a second signal operatively coupled to said electrode, wherein said second signal is substantially equal to said first signal.

58. An occupant sensor for sensing an occupant in a seat as recited in claim 56, further comprising at least one first capacitor by which said first signal is operatively coupled.

59. An occupant sensor for sensing an occupant in a seat as recited in claim 56, further comprising at least one second capacitor by which said second signal is operatively coupled.

60. An occupant sensor for sensing an occupant in a seat as recited in claim 56, further comprising a means for sensing the occupant from a response to said first signal.

61. An occupant sensor for sensing an occupant in a seat as recited in claim 56, further comprising a means for controlling the actuation of a safety restraint system responsive to said first signal.

62. An occupant sensor for sensing an occupant in a seat, wherein said seat incorporates a conductive heating element, said occupant sensor comprising:
  a) a first impedance operatively connecting a first node of said heating element and a source of power;
  b) a second impedance operatively connecting a second node of said heating element and a sink of said power;
  c) a third impedance operatively connecting said first impedance and said source of power;
  d) a fourth impedance operatively connecting said second impedance and said sink of power, wherein when a current is caused to flow between said first and second nodes by said source of power, said heating element generates heat;
  e) a first signal operatively coupled to said heating element at a location at or between said first and second nodes;
  f) a second signal operatively coupled to at least one location selected from a third node between said first and third impedances and a fourth node between said second and fourth impedances, wherein said first signal is an oscillating or pulsed signal, said second signal is substantially equal to said first signal, said first impedance is or is made to be substantially greater responsive to said first signal than responsive to a signal causing said current, said second impedance is or is made to be substantially greater responsive to said first signal than responsive to said signal causing said current, said third impedance is or is made to be substantially greater responsive to said first signal than responsive to a signal causing said current, and said fourth impedance is or is made to be substantially greater responsive to said first signal than responsive to said signal causing said current.

63. An occupant sensor for sensing an occupant in a seat as recited in claim 62, wherein said heating element is arranged so as to at least partially bound a region on a vehicle seat located proximate to a portion of an occupant selected from an infant or child that is closest to said seat when the infant or child is seated in an infant seat, a child seat, or a booster seat, and the infant seat, the child seat or the booster seat is placed on said vehicle seat, and said region is devoid of said heating element.

64. An occupant sensor for sensing an occupant in a seat as recited in claim 63, wherein at least one of said first and second impedances is provided by at least one of respective first and second inductors.

65. An occupant sensor for sensing an occupant in a seat as recited in claim 64, wherein at least one of said third and fourth impedances is provided by at least one of respective third and fourth inductors.

66. An occupant sensor for sensing an occupant in a seat as recited in claim 64, wherein at least one of said third and fourth impedances is provided by at least one of respective third and fourth electronic switches.

67. An occupant sensor for sensing an occupant in a seat as recited in claim 63, wherein at least one of said first and second impedances is provided by at least one of respective first and second electronic switches.

68. An occupant sensor for sensing an occupant in a seat as recited in claim 67, wherein said second signal is operatively coupled to at least one location selected from a control input of said first electronic switch and a control input of said second electronic switch.

69. An occupant sensor for sensing an occupant in a seat as recited in claim 67, wherein at least one of said third and fourth impedances is provided by at least one of respective third and fourth inductors.

70. An occupant sensor for sensing an occupant in a seat as recited in claim 67, wherein at least one of said third and fourth impedances is provided by at least one of respective third and fourth electronic switches.

71. An occupant sensor for sensing an occupant in a seat as recited in claim 62, further comprising at least one first capacitor by which said first signal is operatively coupled.

72. An occupant sensor for sensing an occupant in a seat as recited in claim 62, further comprising at least one second capacitor by which said second signal is operatively coupled.

73. An occupant sensor for sensing an occupant in a seat as recited in claim 62, further comprising a means for sensing the occupant from a response to said first signal.

74. An occupant sensor for sensing an occupant in a seat as recited in claim 62, further comprising a means for controlling the actuation of a safety restraint system responsive to said first signal.

* * * * *